US010374733B2

(12) United States Patent
Anderson et al.

(10) Patent No.: US 10,374,733 B2
(45) Date of Patent: *Aug. 6, 2019

(54) MAGNETIC LINEAR FADER

(71) Applicant: Sound Devices, LLC, Reedsburg, WI (US)

(72) Inventors: Matt Anderson, Baraboo, WI (US); Steven Popovich, Little Chute, WI (US); Paul Isaacs, Middleton, WI (US); Jason McDonald, Reedsburg, WI (US)

(73) Assignee: Sound Devices, LLC, Reedsburg, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/013,027

(22) Filed: Jun. 20, 2018

(65) Prior Publication Data
US 2018/0302180 A1 Oct. 18, 2018

Related U.S. Application Data

(63) Continuation of application No. 15/454,308, filed on Mar. 9, 2017, now Pat. No. 10,014,966.
(Continued)

(51) Int. Cl.
H04R 3/00 (2006.01)
H04H 60/04 (2008.01)
(Continued)

(52) U.S. Cl.
CPC .............. *H04H 60/04* (2013.01); *G01R 33/07* (2013.01); *G01R 33/072* (2013.01); *H01F 7/064* (2013.01); *H02K 41/00* (2013.01); *H04R 3/00* (2013.01)

(58) Field of Classification Search
CPC ......... G06F 3/165; G06F 17/16; G05B 15/02; G05D 17/02; G10H 1/46; G10H 2220/311; G10H 60/04; H04R 60/04
(Continued)

(56) References Cited

U.S. PATENT DOCUMENTS 3,820,096 A 6/1974 Himmelsbach et al.
4,318,038 A * 3/1982 Munehiro ............ H02K 41/031
310/13
(Continued)

FOREIGN PATENT DOCUMENTS

GB 2190995 A * 12/1987 ........... G05B 19/108

OTHER PUBLICATIONS

International Search Report and Written Opinion issued on PCT/US2017/021572, dated May 10, 2017.
(Continued)

*Primary Examiner* — Melur Ramakrishnaiah
(74) *Attorney, Agent, or Firm* — Foley & Lardner LLP

(57) ABSTRACT

A linear fader includes a slider that is configured to slide along a rail. The slider includes a magnet. The linear fader also includes a plurality of coils spaced along a length of the rail, one or more sensors configured to detect a position of the slider along the rail, and control circuitry operatively coupled to the plurality of coils and the one or more sensors. The control circuitry is configured to receive a signal corresponding to a first location of the slider from at least one of the one or more sensors, receive a desired location of the slider, and cause a first electrical current to pass through the plurality of coils, thereby generating a force on the slider in a direction toward the desired location.

20 Claims, 16 Drawing Sheets

Related U.S. Application Data

(60) Provisional application No. 62/307,222, filed on Mar. 11, 2016.

(51) Int. Cl.
   *H01F 7/06* (2006.01)
   *G01R 33/07* (2006.01)
   *H02K 41/00* (2006.01)

(58) Field of Classification Search
   USPC .................................... 381/107, 119; 369/4
   See application file for complete search history.

(56) References Cited

U.S. PATENT DOCUMENTS

| | | |
|---|---|---|
| 5,691,582 A | 11/1997 | Lucas et al. |
| 6,813,361 B1 | 11/2004 | Jeffs et al. |
| 6,950,089 B1 | 9/2005 | Jaeger |
| 8,680,452 B2 | 3/2014 | Mackie et al. |
| 2010/0034400 A1* | 2/2010 | Aiso .................... G06F 3/0362 |
| | | 381/119 |
| 2015/0008768 A1 | 1/2015 | Achterberg et al. |
| 2016/0070275 A1 | 3/2016 | Anderson et al. |

OTHER PUBLICATIONS

Non-Final Office Action on U.S. Appl. No. 15/454,308, dated Oct. 25, 2017.
Notice of Allowance on U.S. Appl. No. 15/454,308, dated Mar. 2, 2018.

* cited by examiner

MAGNETIC LINEAR FADER

CROSS REFERENCE TO RELATED APPLICATIONS

The present application is a continuation of U.S. application Ser. No. 15/454,308, filed Mar. 9, 2017, which claims the benefit of U.S. Provisional Application No. 62/307,222 filed Mar. 11, 2016, which are incorporated herein by reference in their entireties.

BACKGROUND

In audio processing and other electrical signal controls, a typical fader is a device, element, or interface that enables user-control of the amplitude of various input signals. For example, a set of audio faders may allow a processing engineer to selectively and smoothly adjust the amplitude for a number of individual input signals before combining (or mixing) the signals into one or more output signals for recording. Faders are often constructed using either linear sliders (or movers) or linear knobs physically attached to various actuation components through a number of gears, chains, belts, bands, and/or potentiometers. In the case of motorized faders, actuation components connected to electronic control circuitry or programming may drive the physical position of fader controls in response to desired signal level conditions. Historically, adjustment of the physical position has been accomplished through physically connected control mechanisms.

SUMMARY OF THE DISCLOSURE

In many instances, there is a need for a magnetically driven linear fader that is simple in design and capable of offering an enhanced and customizable user-experience. Accordingly, the following disclosure describes systems, methods, devices, and computer media that may help to produce a more efficient, reliable, and user-controllable fader experience through a magnetically driven linear fader. Additionally, susceptibility to wear along with a coggy or gritty feel that is necessarily a part of physically coupled faders due to gears, pulleys, sensors, electrical connections, and/or contact motors may be reduced or eliminated by a linear fader of the present disclosure. A further advantage of some linear fader embodiments is the substantial removal of mechanical interference that allows for more smooth and precise control of the linear fader in terms of the fader position, motion, and/or applied force. Other advantages of the present embodiments will be clear to those of skill in the art.

An illustrative linear fader includes a slider that is configured to slide along a rail. The slider includes a magnet. The linear fader also includes a plurality of coils spaced along a length of the rail, one or more sensors configured to detect a position of the slider along the rail, and control circuitry operatively coupled to the plurality of coils and the one or more sensors. The control circuitry is configured to receive a signal corresponding to a first location of the slider from at least one of the one or more sensors, receive a desired location of the slider, and cause a first electrical current to pass through the plurality of coils, thereby generating a force on the slider in a direction toward the desired location.

An illustrative method includes receiving, from at least one sensor, a location of a slider along a rail. Each sensor is configured to sense a magnetic field of the slider. The method also includes receiving, from a remote processing circuit, a signal corresponding to a desired location of the slider. The method further includes causing a first electrical current to pass through a plurality of coils that are spaced along a length of the rail. The first electrical current generates a magnetic field that applies a force on the slider. The force on the slider is in a direction toward the desired location.

In one embodiment, an illustrative fader apparatus includes a fader control knob directly attached to a magnetic slider (or mover) in a non-contact linear motor. The fader apparatus also includes a sensor system configured to detect a linear position of the slider and control circuitry configured to cause a fade effect in response to detecting the linear position of the slider.

In another embodiment, an example method for using a fader apparatus involves a non-contact sensor system detecting a linear position of a slider of a non-contact motor, with the slider being directly attached to a fader control knob. The method also involves control circuitry causing a fade effect in accordance with the detected linear position of the slider. The fade effect is caused in response to detecting the linear position.

In another example method, a fader apparatus receives a signal representing a desired feel effect for the fader control knob. The method also involves the fader apparatus receiving, from a sensor system, an indication of a user-interaction with the fader control knob. The method further involves responsively controlling a stator current of the fader apparatus to provide a predetermined proportion of force associated with the desired feel effect.

In another example method, a fader apparatus receives a signal representing a desired fade effect. In response to the received signal, the method involves providing a force sufficient to move the fader control knob to a position associated with the desired fade effect.

In another example method, a fader apparatus provides tactile feedback to a user in response to the position of a fader control knob and/or program signals derived from the state of a mixer. These may be in response to signals it receives and/or programmable features for mixing parameters along with the user-selected settings.

In yet another embodiment, an illustrative fader apparatus includes a fader control knob attached to a slider of a non-contact motor. The slider is configured to provide a force sufficient to move the fader control knob to a position associated with a desired fade effect. Further, current through a stator of the non-contact motor is controlled to provide a force of the non-contact motor associated with a desired feel effect when being operated by a user.

The foregoing is a summary of the disclosure and thus by necessity contains simplifications, generalizations and omissions of detail. Consequently, those skilled in the art will appreciate that the summary is illustrative only and is not intended to be in any way limiting. Other aspects, inventive features, and advantages of the devices and/or processes described herein, as defined by the claims, will become apparent in the detailed description set forth herein and taken in conjunction with the accompanying drawings.

DETAILED DESCRIPTION

Disclosed herein are systems, devices and techniques. The devices and systems may include a linear fader apparatus and the techniques may include processes that use or support the use of such linear fader apparatuses. In its construction, the linear fader apparatus may include a fader control knob that may freely move, supported solely on a simple low-friction support (e.g., a bearing, bushing, etc.) along one or two rails and/or channels, having preferably virtually no perceptible opposition to motion and a wear expected to exceed decades of use. In alternate embodiments, a small amount of simulated opposition to motion (e.g., enough to provide a tactile sensation to a user without interfering with a substantially non-contact control described below) may be programmably imposed on the fader control knob and/or the slider. Other than such supporting structures, this design may allow elimination of substantially all physical connections (in any form, mechanical or electrical) required for sensing positions, moving, holding or controlling the feel of the fader control knob.

Figure 1:
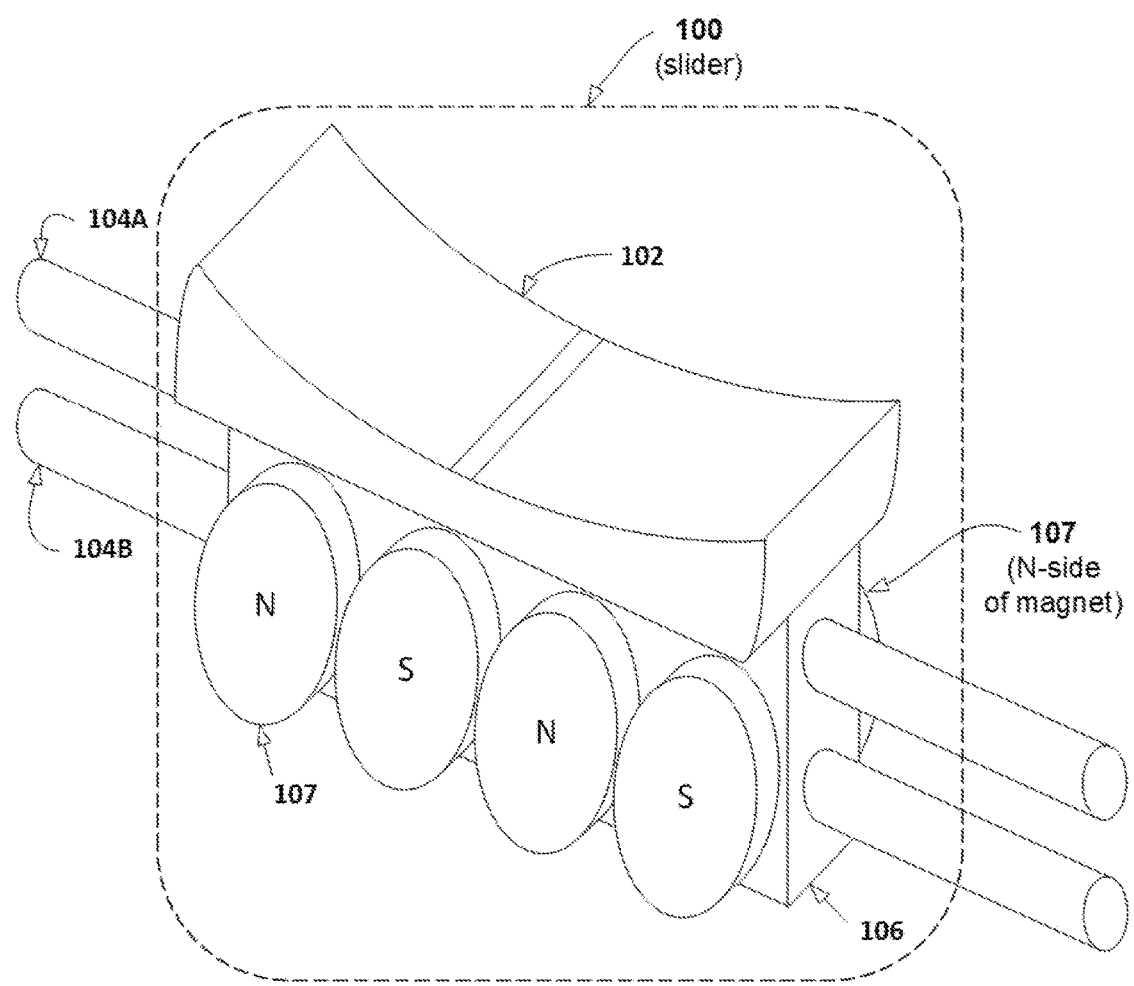
FIG. 1 is a simplified perspective schematic illustrating an arrangement of elements for a linear fader slider mounted on a pair of mounting rails according to an illustrative embodiment.

FIG. 1 is a simplified perspective schematic illustrating an arrangement of elements for a linear fader slider mounted on a pair of mounting rails according to an illustrative embodiment. FIG. 1 shows an arrangement of elements in a linear fader slider 100 according to an example embodiment. The slider 100 is comprised of elements contained entirely within the dashed line. As shown, the slider 100 includes a fader control knob 102 directly coupled to a slider body 106 that includes or has fixedly attached a series of magnets 107. The slider body 106 may incorporate one or guides or openings running either through or oriented along the axis of the slider body 106. The guides or openings may be used to mount the slider 100 to freely move along (or slide along) one or more mounting rails 104. This is in contrast to a traditional rotary fader in which mechanical support is provided to allow rotation at a fixed point on a shaft.

Figure 2:
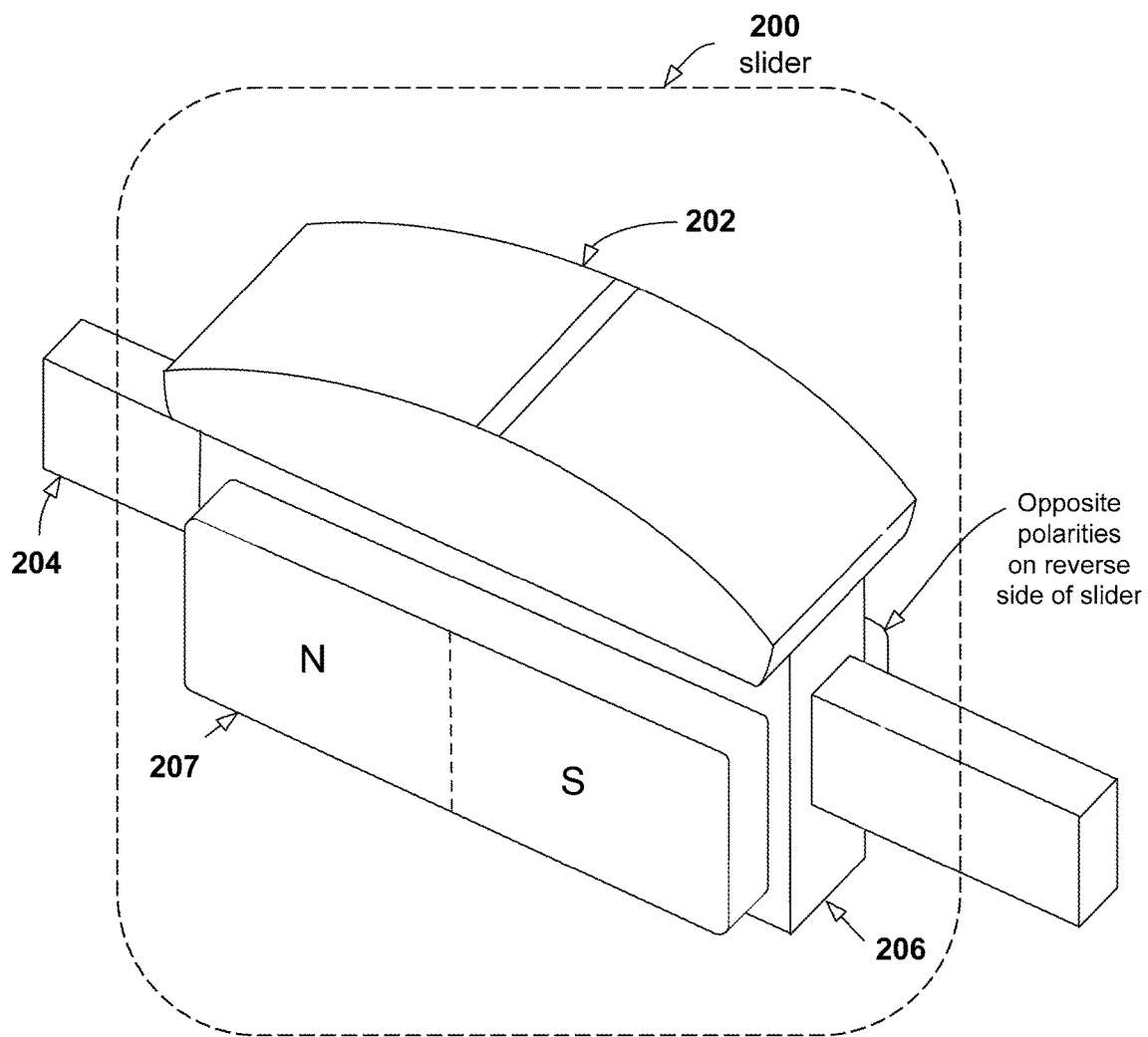
FIG. 2 is a simplified perspective schematic illustrating elements of a linear fader slider mounted on a single mounting rail according to an illustrative embodiment.

FIG. 2 is a simplified perspective schematic illustrating elements of a linear fader slider mounted on a single mounting rail according to an illustrative embodiment. An illustrative slider 200 includes the elements contained entirely within the dashed line. The slider 200 includes a fader control knob 202 that is directly coupled to a slider body 206. The slider body 206 includes or has fixedly attached one or more magnets 207. Similar to the embodiment of FIG. 1, the slider body 206 can include a guide or opening that allows the slider body 206 to slide along the mounting rail 204.

Figure 3:
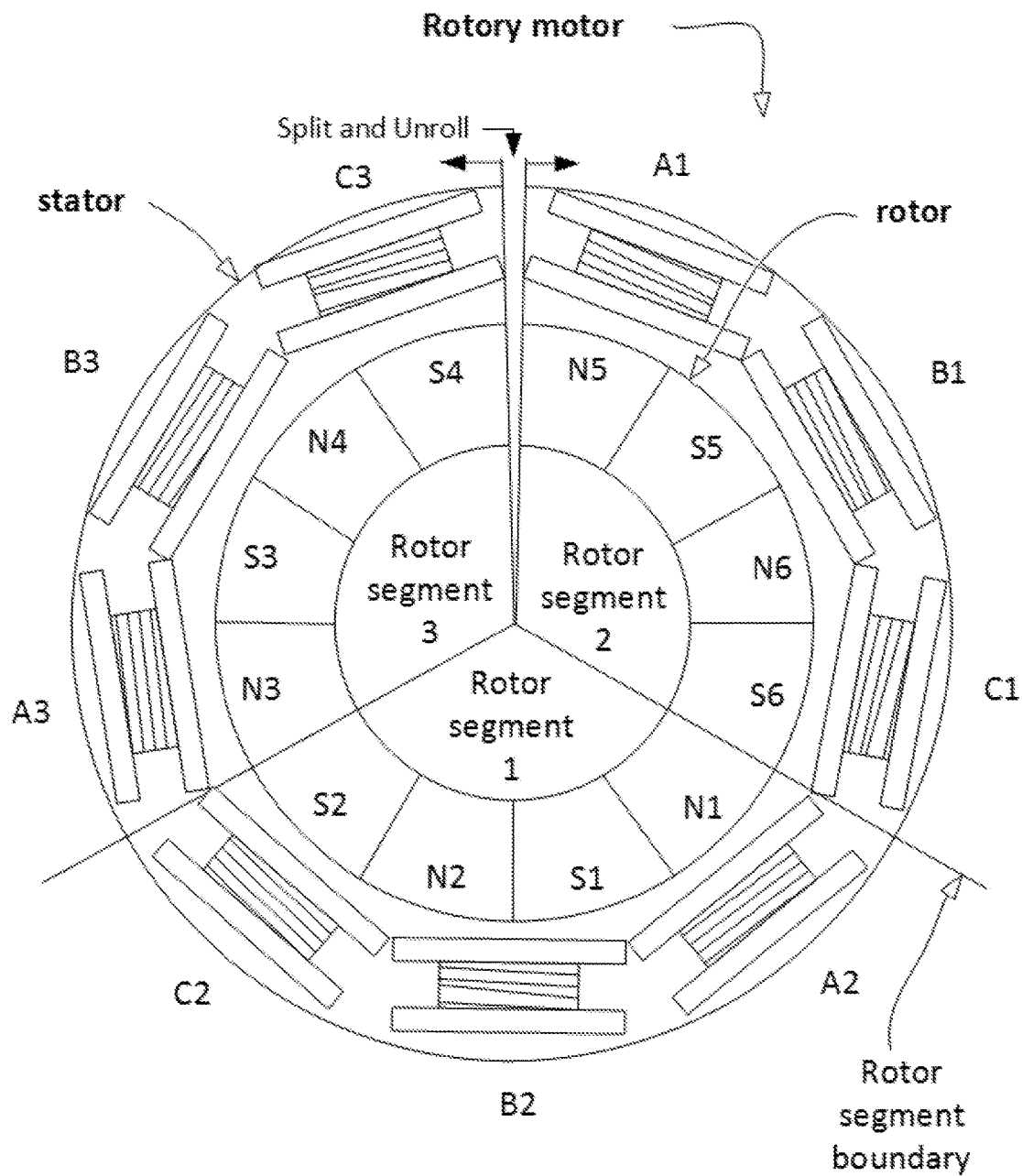
FIG. 3 is a schematic drawing for a rotational electric motor.

FIG. 3 is a schematic drawing for a rotational electric motor. As discussed in greater detail below, the linear fader slider 100 and the linear fader slider 200 can be thought of as including the function, conceptually, of a linear version of a rotary motor as an aid to understanding the functioning of embodiments described herein. That is, while a rotary motor, such as the rotary motor illustrated in FIG. 3, operates by rotating a rotor that, in turn, passes magnets past stator coils around the rotor, a linear fader according to various embodiments operates by sliding magnets past coils (e.g., similar to the stator coils). Thus, conceptually, various embodiments described herein can function as if the stator and rotor were split and unrolled into a linear device as opposed to a rotary device.

Figure 4A:
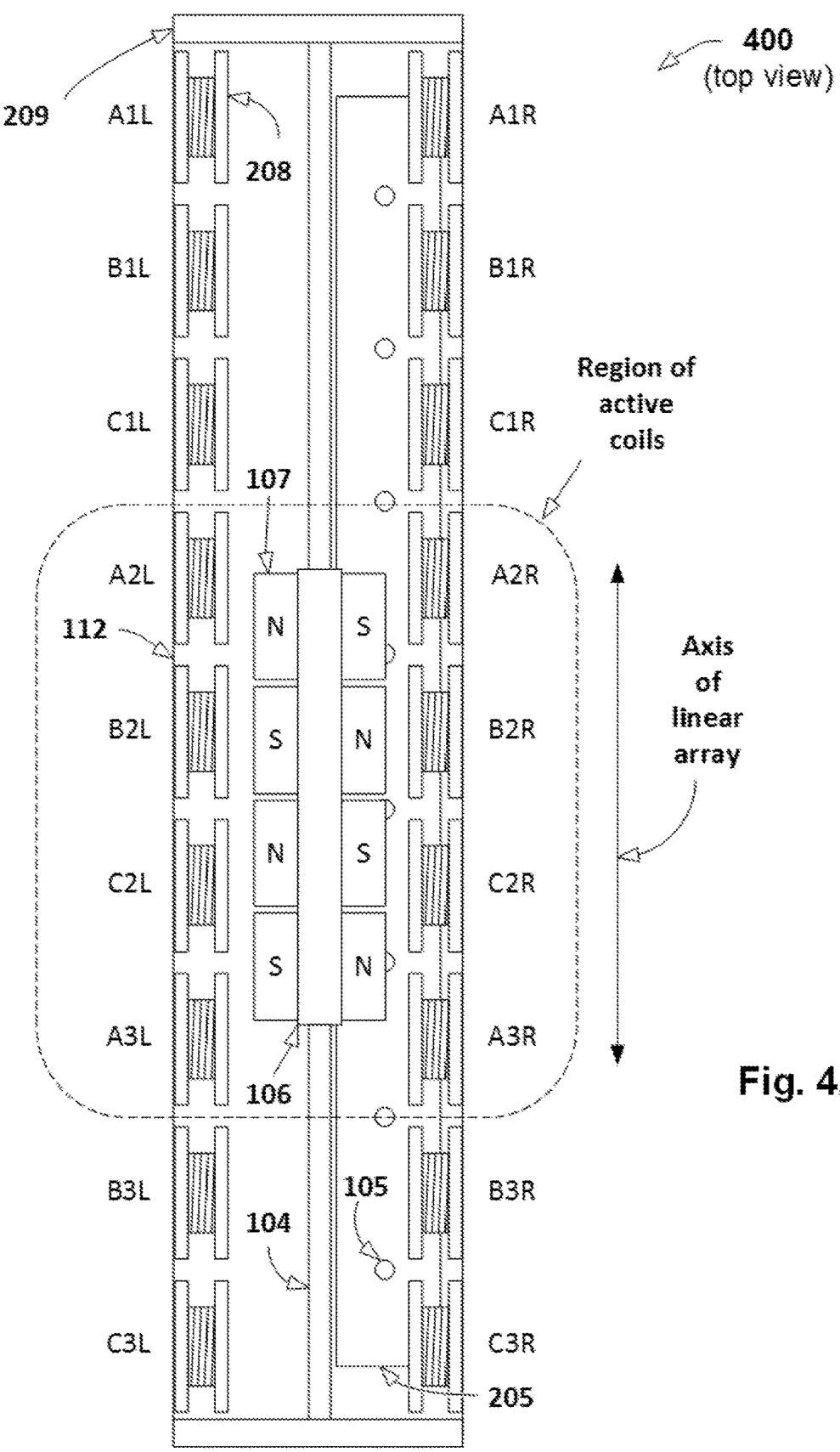
FIGS. 4A-4C are a cross-sectional views of non-contact linear faders according to illustrative embodiments.
Figure 4B:
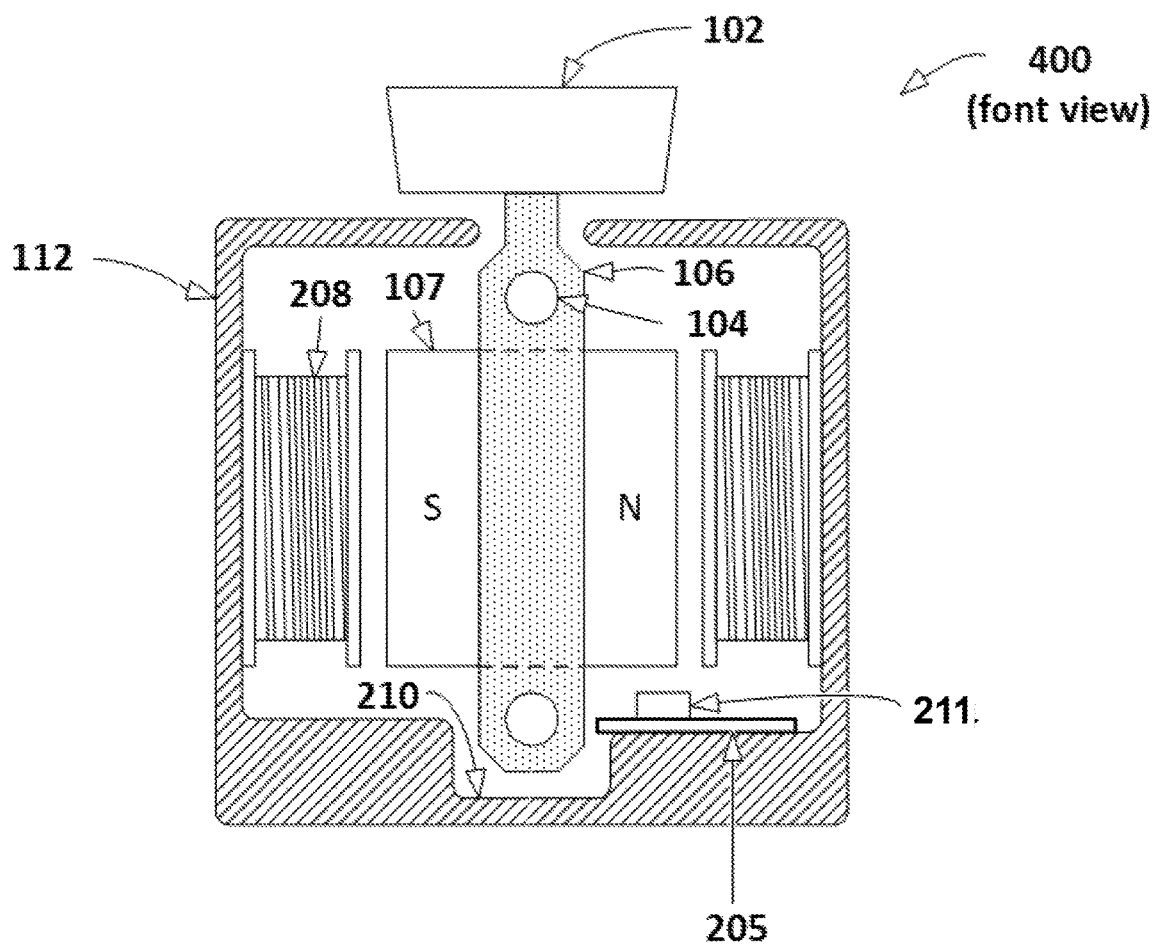
Figure 4C:
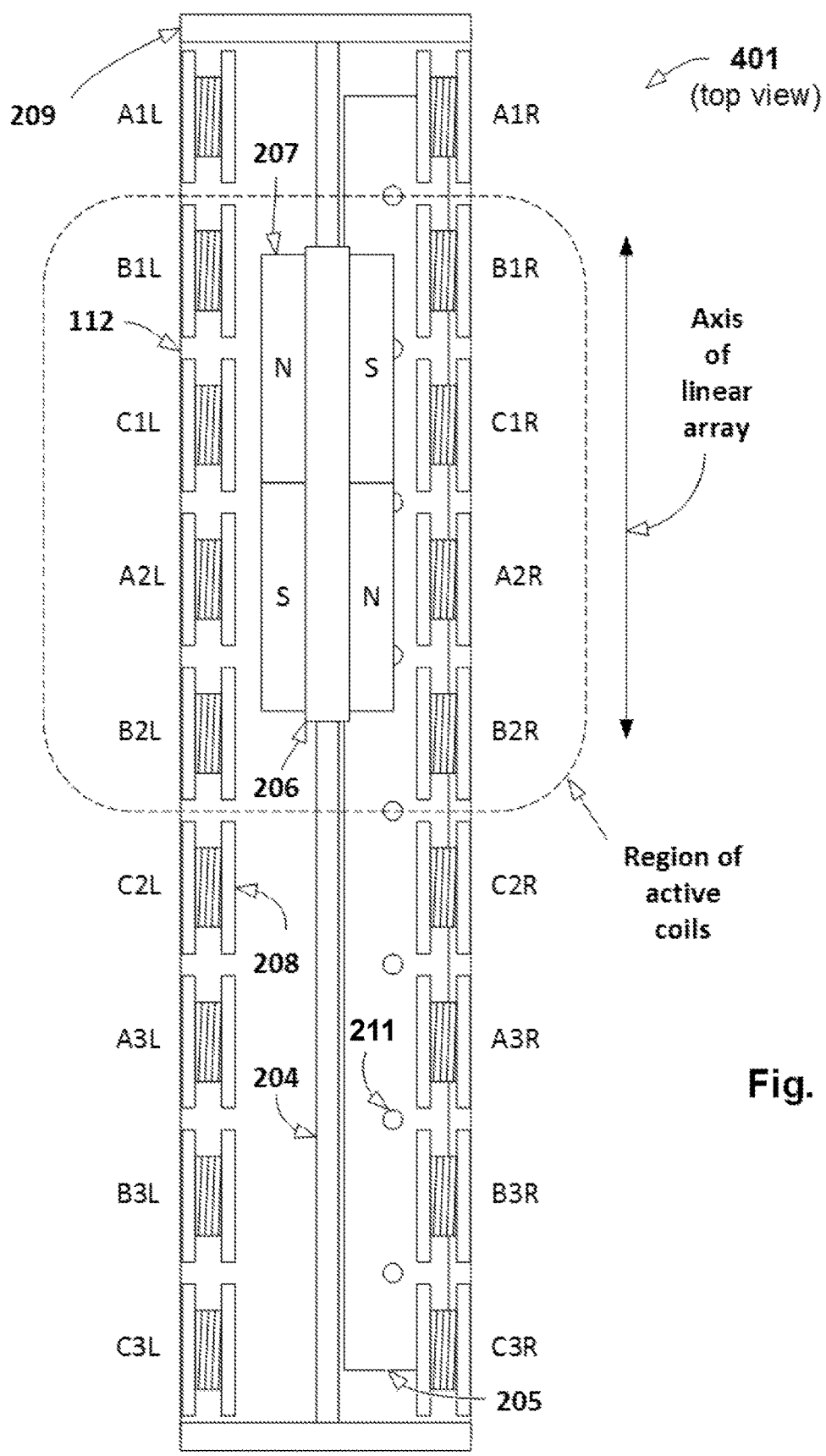

FIGS. 4A-4C are a cross-sectional views of non-contact linear faders according to illustrative embodiments. FIGS. 4A and 4C are cross-sectional views of non-contact linear faders 400 and 401, respectively, from a top-down view to display aspects of the linear motor that are applicable to the embodiments of this disclosure. FIG. 4B is a cross-sectional view of the fader 400 from the font, looking down along the path that the fader 400 travels. That is, the cross-sectional view of FIG. 4B is orthogonal to the cross-sectional view of FIG. 4A.

As shown in FIG. 4A, the slider body 106 of the slider 100 may be configured such that movement is permitted along a channel running between arrays of stator coils 208 on either side, which may be configured to receive the signals (or driven by electrical current) in accordance with a desired position and/or force on the slider 100. As also shown in FIG. 4B, the linear fader 400 also includes a fader housing 112 that runs along the axis of the fader 400 along either side and the bottom of the fader slider 100. The housing 112 may support the stator coils 208. Although the embodiment illustrated in FIG. 4A includes stator coils 208 and magnets 107 along both sides of the rails 104, in an alternative embodiment the stator coils and/or magnets 107 may be on only one side of the rails 104.

In an illustrative embodiment, the linear fader 400 includes end plates 209 or other fixtures attached that provide mechanical support for the one or more mounting rails 104. In contrast to a traditional rotary motor which can include three Hall sensors, a linear array of Hall sensors 105 may be mounted at positions along the axis of the fader 400. The array of Hall sensors 105 may be placed in the vicinity of the movement of the magnets 107 such that the linear position of the slider 400 may be determined. In some embodiments, between 10 and 20 evenly spaced Hall sensors will be included in the array. In alternative embodiments, fewer than 10 or greater than 20 Hall sensors may be used. An advantage provided by a linear array of Hall sensors is that the absolute position of the slider 100 may be determined without the need to count electrical cycles (as is required with a typical rotary motor).

Figure 4D:
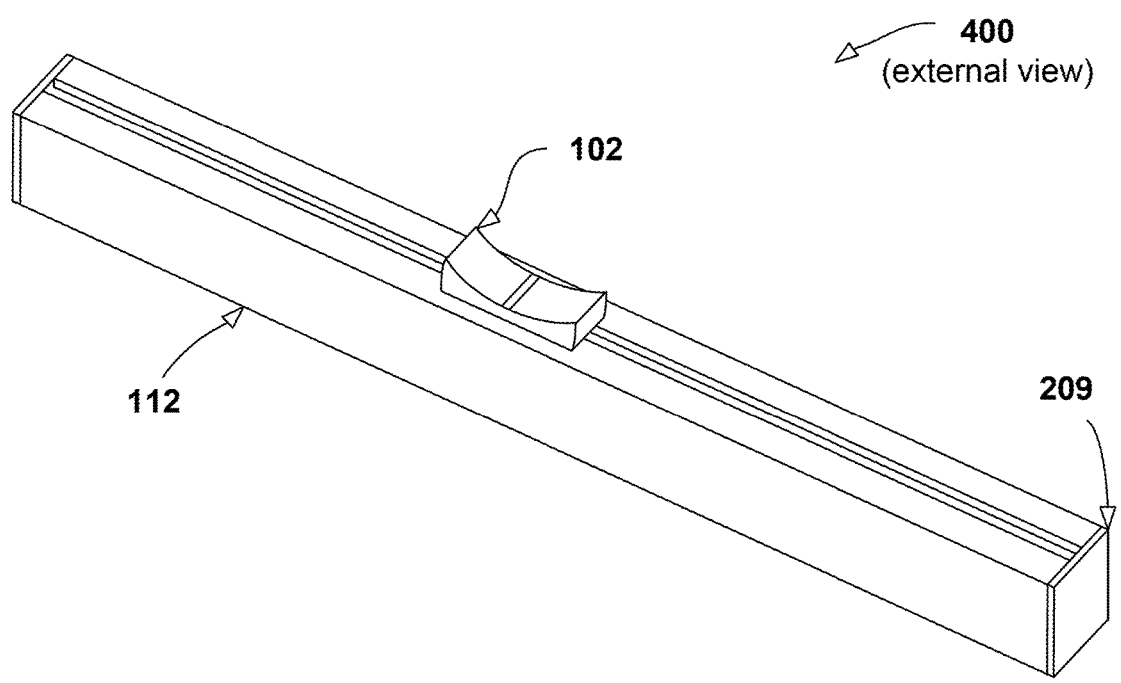
FIG. 4D is a perspective, external view of a non-contact linear fader assembly according to an illustrative embodiment.

FIG. 4D is a perspective, external view of a non-contact linear fader assembly according to an illustrative embodiment. As shown in FIG. 4D, only the fader housing 112, fader knob 102, and end-plates 209 are visible. Although not shown overtly in FIG. 1, 2, or 4A-4D, additional elements, including mechanical support structures and/or electronics, may be used in the embodiment.

In an illustrative embodiment, the fader housing 112 may be 12.9 centimeters (cm) long, 2 cm wide, and 3 cm high. In alternative embodiments, any other suitable dimensions may be used. In an illustrative embodiment, the number of stator coils 208 can be 9 to 15 (e.g., evenly spaced) with the number of Hall sensors 105 ranging from 10 to 14 (e.g., evenly spaced). In an illustrative embodiment using 12 stator coils 208 (i.e., 12 stator coils 208 on each side of the rail 104), the circuit boards 205 are 12.75 cm long with 9 mm spacing between each of the 12 stator coils 208 on each side and 1 cm spacing between each of the 11 Hall sensors 105 along the bottom (e.g., only on one side). In an illustrative embodiment, the slider 100, 200 can travel 10.25 cm. In an illustrative embodiment, the magnet 107 is 2.6 cm long and has four poles along each side (N-S-N-S). In an alternative embodiment, the width of the fader housing 112 can be kept small by placing the coils into the circuit board 205 (e.g., as opposed to using wire windings).

The fader control knob 102 may be any type of linear control interface with which a user may interact. In this context, the word "linear" may be used to describe that the fader control knob 102 is movable in a linear or bidirectional pattern. Such a linear pattern may be preferably along a straight line. In alternative embodiments, the bidirectional pattern may not be along a straight line. For example, the fader control knob 102 may move along a line that curves or twists. In another example, the fader control knob 102 may move along a circumference of a circle or along an outer perimeter of any other suitable shape.

Although some embodiments described herein refer to the knob 102, the knob 102 may be replaced with the knob 202 in alternative embodiments. Similarly, the knob 202 may be replaced with the knob 102 in alternative embodiments. Additionally, the fader control knobs 102 and 202 need not be elongated or shaped as it is shown in FIGS. 1 and 2. Rather, the knobs 102 and 202 may be of any suitable shape. In some configurations, the fader control knobs 102 and 202 may include one or more position indicators to show the relative position of the linear fader 400 or 401. Such indicators may be physical (e.g., a point, divot, scallop, bar) or electronic (e.g., a light on the fader control knob 102, a light on the top plate 112, etc.). In some electronic implementations, a plurality of possible indicator positions (including illuminated positions) may be disposed along the fader control knob 102 trajectory, and one or more particular indicator positions may be activated in accordance with the linear position of the fader 400 or 401. Alternatively, the indicators may indicate a recommended position of the fader 400 or 401 as determined, for example, by signal analysis and control software that is in communication with the fader 400 or 401.

The fader control knob 102 may be fixedly coupled to the slider body 106. In some embodiments, the fader control knob 102 and slider body 106 may be a single element (e.g., a single molded element, a billet element, etc.). In other cases, the fader control knob 102 may be physically attached such that any force applied to the fader control knob 102 is applied to the slider body 106 with substantially equal magnitude. It is noted that some force or motion may be reduced due to slippage, material deformations, or other practical reasons. Such attachment may be keyed, frictional, adhesive, brazed, or any otherwise mounted on the fader control knob. By such attachments, any movement or force applied at the fader control knob 102 will be directly translated to the slider body 106, and any movement or force at the slider body 106 will be directly translated to the fader control knob 102.

The rails 104 may be constructed of any material that has sufficient mechanical strength to fixedly restrict the fader slider 100 to motion along the axis of the linear fader 400 (e.g., along the direction of the rails 104). In some embodiments, the rails 104 may be constructed from a polished metal such as steel. The design may include brass or nylon bearings embedded in the slider body 106 to minimize or eliminate friction associated with movement of the slider body 106 along the mounting rails 104.

As shown in FIG. 1, each rail 104 may be cylindrical in shape and sufficiently long to extend along the slider body 106 to either end along the axis of the linear fader 400 and to connect to the end-plates 209. Other shapes and sizes of the rails 104 may be used in place of the characteristics shown. For example, FIG. 2 shows an alternative embodiment in which only a single, non-cylindrical rail 204 (and bearing) may be used, as shown in the linear fader 401 of FIG. 4C. Although the cylindrical rails 104 or non-cylindrical rail 204 are depicted as relatively long in FIGS. 1 and 2, the rails may be only as long as needed to extend to either side of the array of stator coils 208, or in other embodiments, may be longer where motion of the slider is permitted beyond the termination for either side of the array of stator coils 208. In alternate embodiments, roller-bearing configurations may be employed in the interface between the slider body 206 and rails 204 where the slider is supported by the roller bearings to provide a frictionless support between itself and the stator body 112. Although various embodiments described herein show the use of rails 104 or 204 used to support the movement of the slider body 106 and 206, any other suitable method may be used. For example, the slider body 106 may be supported to move along a form fitting, linear channel. In another example, the slider body 106 may include two or more indentions on an outside surface of the slider body 106 that receive a rail or guide. In yet other examples, the slider body 106 may be supported magnetically, hydraulically, pneumatically, etc. That is, this disclosure is not meant to be limited to embodiments in which one or more rails pass through the slider body 106 or 206.

In FIG. 4B, a wide channel 210 is depicted as being cut or otherwise formed into the lower part of the fader housing 112. The channel 210 provides room for the lower portion of the slider body 106 and lower rail 104 and any associated bearings. In alternative embodiments, a channel 210 placed in the fader housing 112 may serve to guide the slider 100. For example, in FIG. 4B, the upper rail 104 and bearing may be retained, while the lower rail 104 and bearing may be removed with a tab in the slider body 106 extending down into a channel 210 that is formed along the bottom of the fader housing 112. The width of the channel 210 may be decreased for such an embodiment to closely fit the tab extending from the slider body 106 into the channel 210. In other embodiments, the channel 210 may not be used. In yet other embodiments, the slider 100, 200 and rails 104, 204 may be fixedly attached to each other, and bearings may be placed at the interface between the rail(s) 104, 204 and end-plates 209, where the rails 104, 204 are of sufficient length to continue to support the slider 100, 200 as it travels along the axis of the linear fader 400, 401 (e.g., extending beyond and through the end-plates). In these cases, a bearing may be placed in either end-plate 209 to support the rail(s) 104, 204. That is, in such embodiments, the rails 104, 204 may move along with the slider 100, 200 with respect to the housing 112.

Additionally, the slider 100, 200 and the stator coils 208 may constitute at least part of an electrical motor. In an illustrative embodiment, the motor may be a contactless motor in which electrical current is not provided by physical electrical connections to the slider 100, 200. In such a motor, the slider 100, 200 may include magnets 107, 207 (or other magnetic components) disposed along the sides of or through the slider body 106, 206. Such magnetic portions may be permanent or electrically-induced magnetic materials arranged such that north and south poles alternate along the axis of the slider body for the portion that resides between the stator coil arrays 208. For example, FIG. 4A shows a top view of a magnetic slider 100, with four magnets 107 having magnetic poles (with alternating polarities "N" and "S") mounted along the axis of the non-contact linear fader 400. The poles (for magnets 107) are shown in FIG. 1 as having distinct orientation between the north and the south polarities due to distinct magnets being mounted with alternating polarity. In an illustrative embodiment, a single magnet 207, as shown in FIG. 2, may be used which has multiple poles embedded in the magnet 207. The changes between polarities may be gradual between each pair of poles. In such an embodiment, the magnetic flux may be locally interpreted as being roughly sinusoidal along the body 206 of the slider 200. Such an embodiment is in contrast to a rotary motor in which the magnetic field typically exists around the full circumference of both the stator and rotor. In the embodiment of FIG. 1, four poles are present along the side of the slider body 106. In the embodiment of FIG. 2, two poles are present in the magnet 207, as shown along the slider body 206. In the arrangement shown in FIG. 1, 2, 4A, 4B or 4C, the motion or force of the slider 100, 200 may be directly related to the current (subsequently referred to as "stator current") through the coil arrays 208 of the stator unit.

Various embodiments described herein describe a usable contactless linear fader. FIG. 3 is provided to facilitate understanding of embodiments described herein. An example rotary permanent magnet motor with a rotor having twelve magnetic poles situated inside a stator unit having nine coils is illustrated in FIG. 3. The rotary motor of FIG. 3 has a symmetry among the three rotor segments (separated by three lines emanating from the center of the rotor in FIG. 3, where at the top is shown a conceptual "split"). Because of the symmetry, the positional relationship (or phasing relationship) between each segment and the nearby coils remains similar compared to each of the other two segments. For example, as shown, each rotor segment overlaps with three corresponding coils (i.e., the A-phase coils, the B-phase coils, and the C-phase coils). If the rotor is rotated clockwise by 20 degrees, each segment will overlap entirely with the two original B-phase and C-phase coils and provide a half overlap with the next (leading) A-phase coils and lagging A-phase coil. Upon another 20 degree clockwise rotation, each segment will overlap the two original B-phase and C-phase coils and completely overlap the next leading A-phase coil. Continuing rotations continue to preserve identical similarities in the phase relationship between each magnet segment and the phasing of respective overlapped coils.

A sinusoidal-based field-oriented-control (FOC) for a rotary motor has the ability to have expressed computationally both the magnetic flux and current (inducing magnetic fields in the coils) in the format of complex phasors. When expressed with respect to a rotating frame of reference (linked to the angular position of the magnetic rotor via the Clark and Park transforms), the torque can be expressed as a function of the current and flux components of the stator current vector. FOC also provides smooth torque (e.g., relatively free of ripple).

In one example of the rotary motor of FIG. 3, each coil associated with a given phase of the coils is driven identically to the other coils having the same phase. Thus, a similar electrical current is applied through phases A1, A2, and A3, as is also the case for phases B1, B2, and B3 and phases C1, C2, and C3. Because of the symmetry, each segment contributes one third of the torque to the rotor at all times. Therefore, if the magnets in segments 2 and 3 were removed while maintaining the phase currents, the rotor would continue to produce one third of the commanded torque using FOC rotary control techniques. A similar analysis may be extended to a linear motor by "unwrapping" the motor along the split, as indicated at the top of FIG. 3. The unwrapped motor has a linear arrangement of 9 coils spaced from a four-magnet segment. In contrast to a rotary motor, the linear fader 400 configuration uses an array of coils 208 that are linearly arranged along the axis of travel for a slider. In other embodiments, a linear array of 12 to 18 or an arbitrary number of coils may be used, as the coil arrays 208 may be arbitrarily extended. A force component exists along the axis of the linear array, which is conceptually similar to torque in a rotary motor. Part of the force component is directed along the axis, while part of the force component attracts the slider toward the magnets, which may place a strain on the bearing(s) and rail(s), if so equipped. Furthermore, unlike the rotary case, where after one full revolution a given magnet will revisit the same coil, additional coils are placed along the axis for continued travel in the embodiments illustrated in FIGS. 4A-4C. Following the example above in which the rotary motor is "unwrapped" and extended to produce a linear motor, if the coils for the motor of FIG. 3 were driven such that the rotor experiences a clockwise torque, providing similar currents in the coils for the linear array of FIG. 4A would produce a corresponding downward force component along the axis of the array. In contrast, a counterclockwise torque for the rotary motor of FIG. 3 would correspond to an upward force component along the axis of the linear array of FIG. 4A.

In the non-contact faders of FIGS. 4A and 4C, two linear (e.g., "unwrapped") arrays of coils 208 are positioned on either side of the linear slider 100, 200, respectively, with each linear slider 100, 200 containing an array of four magnets 107, 207 with alternating polarity on each side along the axis of the slider body 106, 206. In some embodiments, the magnets 107, 207 may protrude through the slider body 106, 206. In other embodiments, pairs of magnets may be affixed on either side of the slider body 106, 206. In an illustrative embodiment of a linear fader, one departure from the rotary motor design is that the coils 208 are symmetrically placed on either side of the linear fader slider 100, 200 in pairs. For example, coil pair A1 may refer to the pair of coils labeled as A1L and A1R, coil pair B1 may refer to the pair of coils labeled as B1L and B2R, and so on. In such an example, the "L" label corresponds to a left side, and the "R" label corresponds to a right side, such as from the view of FIGS. 4A and 4C. In an illustrative embodiment, for each pair, each coil on either side is driven with identical currents. For example, the current in either of the coils labeled phase A1L and A1R are in the same direction and have identical magnitude, as is also the case for coil pairs labeled B1, C1, A2, and so forth. In an illustrative embodiment, the coils in each pair may be identical and wired in series such that each coil receives the same magnitude and direction of current. Such an arrangement provides the advantage that any force components that are not aligned along the axis of the linear fader cancel out, leaving only a balanced force component pointing directly along the axis of the linear fader 400. Such a balance removes the side-to-side pull or strain on the slider 100, 200, thereby reducing or removing friction between the slider bearing and support rail(s) 104, 204 (or other support apparatus such as a channel and tab).

In the description above of the rotary motor, currents in each phase (e.g. phase for coil pairs A1, A2 and A3) were assumed similar to simplify the description for the method of control. However, unlike in the rotary case, coils 208 which are at a distance from the slider 100 or 200 may be de-energized (e.g., provided with no electrical current) without significantly affecting the force components, which reduces power loss. In an illustrative embodiment, only coils in the coil arrays 208 that are in the vicinity of the slider 100 or 200 are driven with a current. Again, in contrast to the rotary case in which every segment contains energized coils, a region in which coils are activated will follow the slider 100, 200 as the slider 100, 200 moves up and down along the axis of the linear fader. This is apparent when observing the differing slider position in FIG. 4A versus 4C and the roughly labelled "Region of active coils," where only coils contained in these region would be energized. For example, when the slider body 106 is in the position as shown in FIG. 4A, only coil pairs A2, B2, C2, and A3 are energized.

The end-plates 209 mounted at either end of the linear fader 400, 401 can be used to contain the motion for the slider 100, 200. In the embodiment shown in FIG. 4B, the external housing 112 wraps around the sides and underside of the linear fader 400 and provides support for the coils 208. In an illustrative embodiment, the housing 112 may be constructed of a material having a high relative permeability to provide a magnetic pathway such that magnetic field lines created by current supplied to the coils 208, and corresponding force components, are strengthened.

In the three-phase system of FIG. 4A or 4B with windings of the stator unit grouped as either A (for the group of pairs A1, A2, and A3), B (for the group of pairs B1, B2, and B3), or C (for the group of pairs C1, C2, and C3) the relationship between the (scalar) values for the current through the windings A, B, and C ($i_a$, $i_b$, and $i_c$, respectively) of the stator unit (e.g., that are near the slider) and the complex (vector) stator current ($i_s$) may be defined based on space vectors by the relation:

$$\vec{l}_s = i_a + e^{j\pi 2/3} i_b + e^{j\pi 4/3} i_c = |\vec{l}_s| e^{j\varphi}$$

where $\vec{l}_s$ is the phasor stator current vector with an angle $\varphi$ and a magnitude $|\vec{l}_s|$. The phasor stator current may also be represented based on the following relationship:

$$\vec{l}_s = i_{s\alpha} + j i_{s\beta}$$

with:

$$i_{s\alpha} = |\vec{l}_s| \cos(\varphi)$$

and $$i_{s\gamma} = |\vec{l}_s| \sin(\varphi).$$

In addition to describing the currents through the coils as phasors having a magnitude and angle, the phasor currents may be referenced in relation to a moving (or rotating for the rotary case) frame of reference referred to by an in-phase axis (called the d-axis, aligned with the magnetic flux) and a quadrature axis (called the q-axis). The stator current may be decomposed into components projected onto the d- and q-axes, or a flux current component ($i_{sd}$) and force current component ($i_{sq}$), respectively, using the Clark and Park transforms where:

$$i_{sd} = i_{s\alpha} \cos(\theta) + i_{s\beta} \sin(\theta)$$

and $$i_{sq} = -i_{s\alpha} \sin(\theta) + i_{s\beta} \cos(\theta)$$

and $\theta$ is the inferred physical (in dependence of the position of the slider magnets relative to the phase A through C) flux angle In particular, $i_{sq}$ represents that component of $\vec{l}_s$ responsible for producing a linear force (or torque in the rotary motor case). Such an analysis assumes an extenuation of the assumed roughly sinusoidal distribution of magnetic flux along the axis of the slider magnets, extending in both directions. The above explanation and relationships are one example of how some embodiments function. However, alternative embodiments may use any other suitable theory, relationship, or explanation.

For the embodiments shown in FIGS. 4A, and 4C, the magnetic field when measured closely along the sides of magnets 107, 207 may have a roughly sinusoidal or, alternatively, trapezoidal distribution. When current is applied to the stator coil arrays 208, a magnetic field is generated that extends through and interacts with the slider magnets 107, 207. Therefore, if a current phasor is supplied to all coils 208 (e.g., both inside and outside the "region of active coils"), multiple linear positions exist where the local flux vector (as referenced into a wrapped circular frame) is in alignment with the current vector (again as wrapped into a circular frame). This results in multiple physically stable linear positions for the slider that are spaced by 360 degrees with reference to the magnet flux (or in physical terms, the width of two of the slider magnets). This could be considered as analogous to the cogging effect observed for a rotary motor when a fixed current is supplied to the windings. When the slider 100, 200 is physically moved out of such a stable condition, and while the fixed current vector continues to be supplied, a force component aligned with the axis of the linear array results and in a direction to realign the flux and current vectors until the slider is moved halfway (e.g., 180 degrees) to an adjacent unstable condition. At this point the force component along the axis of the linear array will cease. Both pairs of coils from each pair have identical current oriented in the same direction (as viewed looking through them from the side of the fader 400, 401 through both coils arrays 208) and the magnet polarities on either side of the slider 106, 206 are opposite, so force components orthogonal to the axis of the linear array also approximately cancel. Past this point, the force begins working in the opposite direction with continued motion until 360 degrees has been traversed to a new stable point. Thus, a smooth sinusoidal cogging force may be experienced with several stable positions separated by local areas of instability as the slider is moved across the span from contacting one end-plate 209 to the other.

In an illustrative embodiment, the control system applies the same currents as described above, but only in the "region of active coils" as illustrated in FIGS. 4A and 4C. As long as coils removed from this region are deactivated and coils brought into this region are activated as the slider moves, a similar force-cogging relationship is observed.

In an illustrative embodiment, the linear force produced in the motor 400, 401 is approximately proportional to the force current component ($i_{sq}$) that is generated due to the applied current and magnetic structure of the windings in the coil arrays 208. By controlling the current applied to the stator to produce a particular stator magnetic field, a force may be induced in the slider 100, 200 that in in a direction to align the magnetic field of the slider with the stator magnetic field created by those coils 208 in the region of the active coils that are driven by a current. For a fixed level of magnetic field (or current), the maximum force may be obtained when the phasor magnetic fields for the stator arrays 208 and the slider magnets 107 flux (when measured from the current physical position of the slider 100, 200) vector differ by +/−90 degrees. This corresponds to conditions for producing the maximum upward or downward force on the slider 100, 200 from the top-view perspective of FIG. 4A or 4C.

Furthermore, in instances in which the fader control knob 102 is held or moved by a user or other outside force, an arbitrary force (within rated limits of the fader) may be produced by varying the magnitude and phase of the current vector corresponding to that linear position. Specifically, for some motor constant, $k_T$, that depends on the physical parameters, a programmable force, F, may be produced with either a positive or a negative value described by the equation:

$$F = k_T |\vec{i_s}| \sin(\varphi - \theta),$$

where $\theta$ is the inferred physical angular phase of the d-axis, and $\varphi$ is the inferred physical angular phase of the current.

Even though control techniques based on approximating a linearized three-phase approach in the region of active coils are described herein, embodiments relying on other topologies (other than 3-phase) are envisioned within the scope of this disclosure. For example, a linearized two-phase (e.g., quadrature) approach may be used where alternate coil pairs are assigned to one phase or the other. In another example, a single-phase, 4-phase, 5-phase, 6-phase, etc. system may also be used.

In some embodiments, markings on the top fader housing 112 or a plate mounted over the fader housing 112 or fader 400 may provide indications of the notches and where the stable positions are located (e.g., with respect to some marking or feature on the fader control knob 102). Such markings may include descriptors of the levels. For example, an audio fader in which each notch represents a decibel sound level may include markings that show what decibel level is associated with each notch. As explained in greater detail below, notches may change position, number, and/or other characteristics. In an illustrative embodiment, the markings on the fader housing 112 or marking plate mounted on top may be changeable (e.g., moving, dynamic, displayed, virtual, etc.) to show the current settings of the linear fader 400. In an embodiment in which the fader control knob 102 is allowed to move multiple increments, the markings may change depending on which segment over the linear fader 400 the fader control knob is currently operating.

In an illustrative embodiment, when the current through the coils 208 of the stator is changed in a way that alters the current vector alignment, a physical movement may be produced in the slider 100, 200 by shifting the phase of the current vector (e.g., of sufficient magnitude to overcome friction, slider inertial mass, and/or other opposition to motion). Thus, the linear fader 400 may move the slider 100, 200 to an arbitrary position by driving or holding the current vector at a phase corresponding to a desired physical position or movement.

In some embodiments, the stator coils 208 may be in close proximity, or attached directly to the fader housing 112. In such an embodiment, circuitry that controls and/or monitors the current in the stator coils 208 may be included along the lower portion of the fader housing 112. In other embodiments, the stator coils 208 may be implemented as part of a printed circuit board (PCB) that is mounted along either side of the fader housing 112, where processing circuitry is either included with such PCB's or with other PCB's mounted in parallel or beneath the upper portion of the fader housing 112. Indeed, such processing circuitry, the stator coils 208, rail 104, 204 and fader housing 112 and other mechanical constructs may be treated as a single integrated "stator unit." Similarly, the slider body 106, 206, magnets 107, 207 and the fader control knob 102 may also be treated as an integrated, solid-state "slider-knob unit" that, within itself, may only require the presence of magnets for operation. Furthermore, the slider-knob unit may freely slide in a substantially non-contact coupling with the stator-support unit. The "non-contact" nature of the slider-knob unit and the stator-support unit may be further described in terms of exchange of energy and information between the stator-support unit and the slider unit 100, 200. For example, by virtue of having a non-contact exchange of energy between the slider-knob unit and the stator-support unit, no physical electrical connection or mechanical mechanism may be used for transferring energy (e.g., force in the direction of movement or stationary force from which energy may be derived if movement is allowed) into the slider-knob unit. In such embodiments, energy may be transmitted to the slider-knob unit by way of a magnetic coupling across the gap separating the slider-knob unit and, on either side, the stator-support unit (containing stator windings). Therefore, in at least some embodiments, even though a mechanical (e.g., a support component in the form of a linear bearing(s), rail(s) or track) may be provided between the slider-knob unit and stator-support unit, the energy transferred into the slider-knob unit may be entirely magnetic. Furthermore, the Hall-sensors 204 described above may also be magnetically coupled to the slider 100, 200. Therefore, both energy transfer into and information transfer out of the slider-knob unit may require no physical connection or contact between the slider-knob unit and the stator-support unit. In light of the contactless exchange of information and energy, the combination of stator-support unit and slider-knob unit are considered a "non-contact linear motor" that allows position, movement, and force to be applied to the fader knob 102 along with determining its position.

Some embodiments of the fader 400, 401 have included in the fader 400, 401 Hall effect sensors 204 that are integrated into the circuit board 205, which attaches to the fader housing 112. Each Hall effect sensor 204 may provide an output waveform indicative of the position for the slider 100, 200 whenever one of the magnets 107, 207 is in the vicinity of the respective Hall effect sensor 204. The collective output from all Hall effect sensors 204 provides the information required to determine the position of the slider 100, 200 with respect to some fixed reference location, such as an end-stop. In this capacity, the unit may track movements of the slider 100, 200 (and, therefore, the movements of the fader control knob 102) to determine how to fade or alter an input sound signal. One set of example relative locations for three Hall-effect sensors 204 are indicated in FIGS. 4A and 4C. As shown, the Hall effect sensors 204 may each detect the induced Hall effect from a different magnetic polarity of the slider 100, 200 that happens to align with the sensor.

In some embodiments, Hall sensors, or other sensors (e.g., light or sound-based proximity sensors, capacitive or magnetic air-gap sensors, actuators, motion sensors, mechanical connectors) may be used for detecting translational movement of the slider 100, 200 or other elements of the linear fader 400.

In an illustrative embodiment, the linear fader 400 includes various components and subsystems that function to alter input signals (such as amplifying or attenuating audio signals) in accordance with movements at the linear fader. In an illustrative embodiment, the linear fader 400 may include linear motor-control circuitry that cause movements at the slider 100, 200 based on stored or received input signals.

Figure 5:
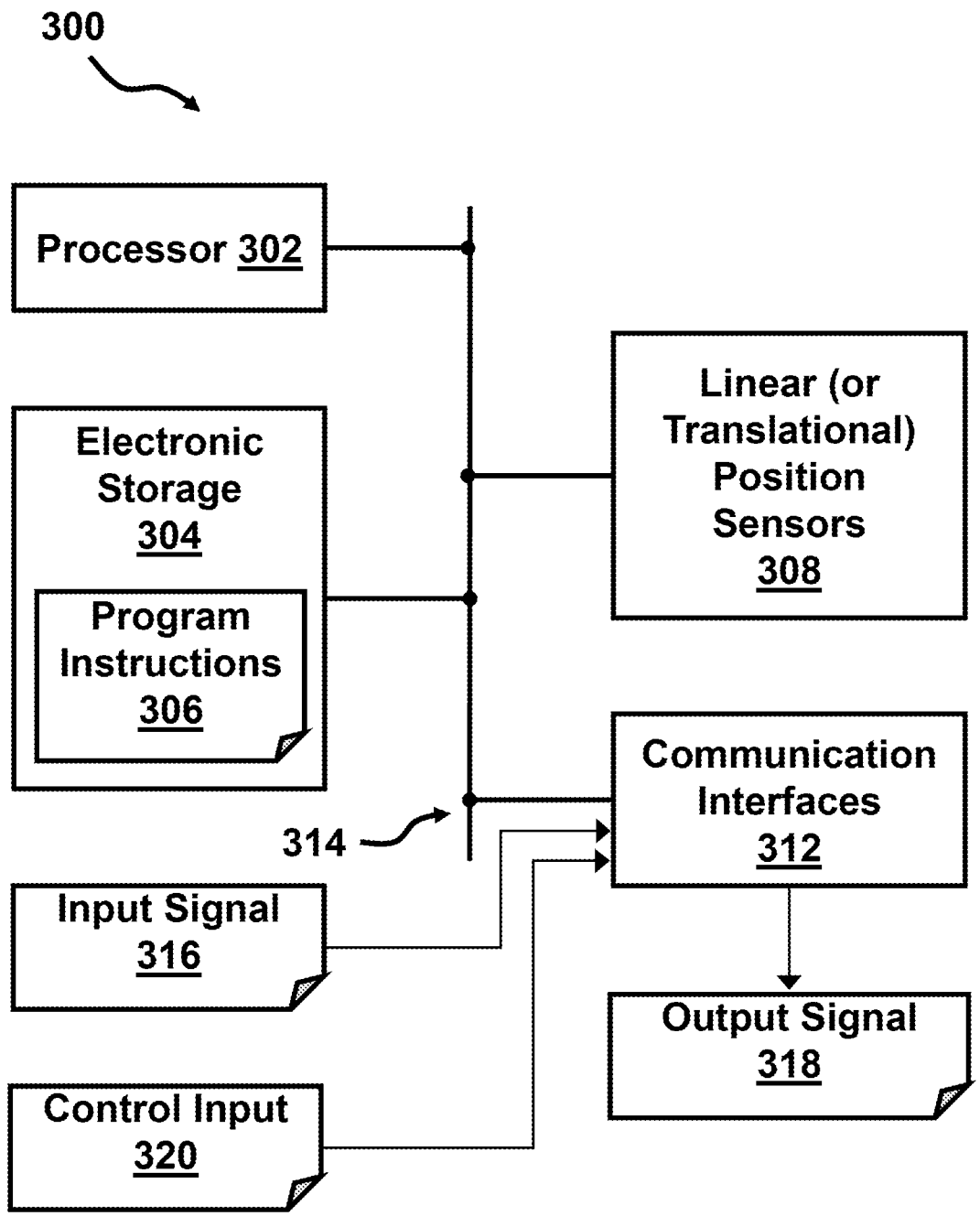
FIG. 5 is a simplified block diagram illustrating elements of a linear fader according to an illustrative embodiment.

FIG. 5 is a simplified block diagram illustrating elements of a linear fader according to an illustrative embodiment. In an illustrative embodiment, in addition to the components described in FIG. 1, the linear fader 300 may include a processor 302, electronic storage 304, linear (or translational) position sensors 308, and communication interfaces 312, all communicatively connected through bus 314. Certain data elements may also be considered part of the linear fader 300 either because such elements are physically stored or received as non-transitory media, or because the linear fader affects such elements in a physically measurable way. For example, FIG. 5 shows program instructions 306, input signal 316, output signal 318, and control input 320 as elements that are a part of, or associated with, the linear fader 300. Although signals like the input signal 316, the output signal 318, and the control input 320 are likely dynamically varying electrical properties, they are still physical signals that represent other tangible properties (such as sound waves or controller positions).

The processor 302 may include any processor type capable of executing the program instructions 306 to perform the functions described herein. For example, the processor 302 may be any general-purpose processor, specialized processing unit, or device containing processing elements. In some cases, multiple processing units may be connected and utilized in combination to perform the various functions of the processor 302. In at least some embodiments, the processor 302 may be a Piccolo microcontroller by Texas Instruments Inc., although other types of microcontrollers and/or processors may be used in other embodiments.

The electronic storage 304 may be any available media that may be accessed by the processor 302 and any other processing elements in the linear fader 300. By way of example, the electronic storage 304 may include random access memory (RAM), read-only memory (ROM), erasable programmable read-only memory (EPROM), electronically erasable programmable read-only memory (EEPROM), not-and gate (NAND)-based flash memory, compact disk read-only memory (CD-ROM), Blu-ray, or other optical disk storage, magnetic disk storage or other magnetic storage devices, or any other medium that may be used to carry or store desired program code in the form of program instructions or data structures, and which may be executed by a processor. In some cases, the electronic storage 304 may include computer-readable media (CRM). When information is transferred or provided over a network or another communications connection (either hardwired, wireless, or a combination of hardwired or wireless) to a machine, the machine may properly view the connection as a type of electronic storage. Thus, any such connection to a computing device, processor, or control circuit is properly termed electronic storage (or CRM if the signal is readable by a computing device). Combinations of the above are also included within the scope of computer-readable media.

The program instructions 306 may include, for example, instructions and data capable of causing a processing unit, a general-purpose computer, a special-purpose computer, special-purpose processing machines, or remote server systems to perform a certain function or group of functions. These instructions need not be digital or composed in any high-level programming language. Rather, the program instructions 306 may be any set of signal-producing or signal-altering circuitry or media that are capable of preforming function such as those described in the example methods in this disclosure.

As described above, the linear position sensors 308 may include various types of contact and non-contact detection devices, actuate-able interfaces, and/or computing systems. In some cases, these positions/movements may be measured by separate devices or systems. In other cases, some or all of the functions associated with the linear position sensors 308 may be performed by the same devices or systems.

For simplicity, the bus 314 is shown in FIG. 5 as a single connection between all elements. However, elements in an illustrative system may connect through a variety of interfaces, communication paths, and networking components. Connections may be wired, wireless, optical, mechanical, or any other connector type. Additionally, some components that are shown as directly connected to through the bus 314 may actually connect to one another only through some other element on the bus.

The communication interfaces 312 may include, for example, wireless chipsets, antennae, wired ports, signal converters, communication protocols, and other hardware and software for interfacing with external systems. For example, the linear fader 300 may receive text, audio, executable code, video, digital information or other data via the communication interfaces 312 from remote data sources (e.g., remote servers, internet locations, intranet locations, wireless data networks, digital audio databases, etc.) or from local media sources (e.g., external drives, memory cards, specialized input systems, wired port connections, wireless terminals, microphones, speakers, etc.). Example communication networks include Public Switched Telephone Network (PSTN), Public Switched Data Network (PSDN), a short message service (SMS) network, a local-area network (LAN), a voice over IP (VoIP) network, a wide area networks (WAN), a virtual private network (VPN), a campus area network, and the Internet. An example network may communicate through wireless, wired, mechanical, and or optical communication links. Many other communication networks may also be suitable for the embodiments discussed herein.

Furthermore, the communication interfaces 312 may include user-interfaces to facilitate receiving user-input and user-commands into the linear fader 300 and outputting information and prompts for presentation to a user. Although the user-interfaces of the communication interfaces 312 typically connect with human users, these user-interfaces may alternatively connect to automated, animal, or other non-human "users." Additionally, while input and output are described herein as occurring with a user present, the user-interfaces need not present information to any actual user in order for present functions to be performed. User-input may be received as, for instance, wireless/remote control signals, touch-screen input, actuation of buttons/switches, audio/speech input, motion input, lack of interaction for a predefined time period, and/or other user-interface signals. Information may be presented to the user as, for instance, video, images, audio signals, text, remote device operation, mechanical signals, media file output, etc. In some cases, separate devices may be operated to facilitate user-interface functions.

The linear fader 300 may include many other features in accordance with various embodiments. For instance, some embodiments may include a dedicated power source, which is not shown. In practice, such a power source may include batteries, capacitors, generators, transformers and/or other power providing sources. Other embodiments may include power-connecting interfaces that are operable to communicate power from external power sources to elements in the linear fader 300, 400, 401. As another example, the linear fader 300, 400, 401 may include external protective surfaces or casing to enclose various parts and devices in the linear fader. As yet another example, the linear fader 300, 400, 401 may include equipment that monitors the functions and state of the linear fader itself, such as to check for malfunction. Further, sensors may also be affixed on, or near, the fader control knob 102 in a position at which the sensors may detect the presence of a user's hand for a number of potential benefits described in greater detail below.

Functions and procedures described herein may be executed according to any of several embodiments. For example, procedures may be performed by specialized equipment that is designed to perform the particular functions. As another example, the functions may be performed by general-use equipment that executes commands related to the procedures. As a further example, each function may be performed by a different piece of equipment with one piece of equipment serving as control or with a separate control device.

FIGS. 6-12 are flowcharts of processes for operating a linear fader according to illustrative embodiments. Although the figures show a specific order of method steps, the order of the steps may differ from what is depicted. Also, two or more steps may be performed concurrently or with partial concurrence. Such variations may depend on the software and hardware systems chosen and the specific embodiment. All such variations are within the scope of the disclosure. Likewise, software implementations may be accomplished with standard programming techniques with rule-based logic and other logic to accomplish the various connection steps, processing steps, comparison steps, and decision steps.

Figure 6:
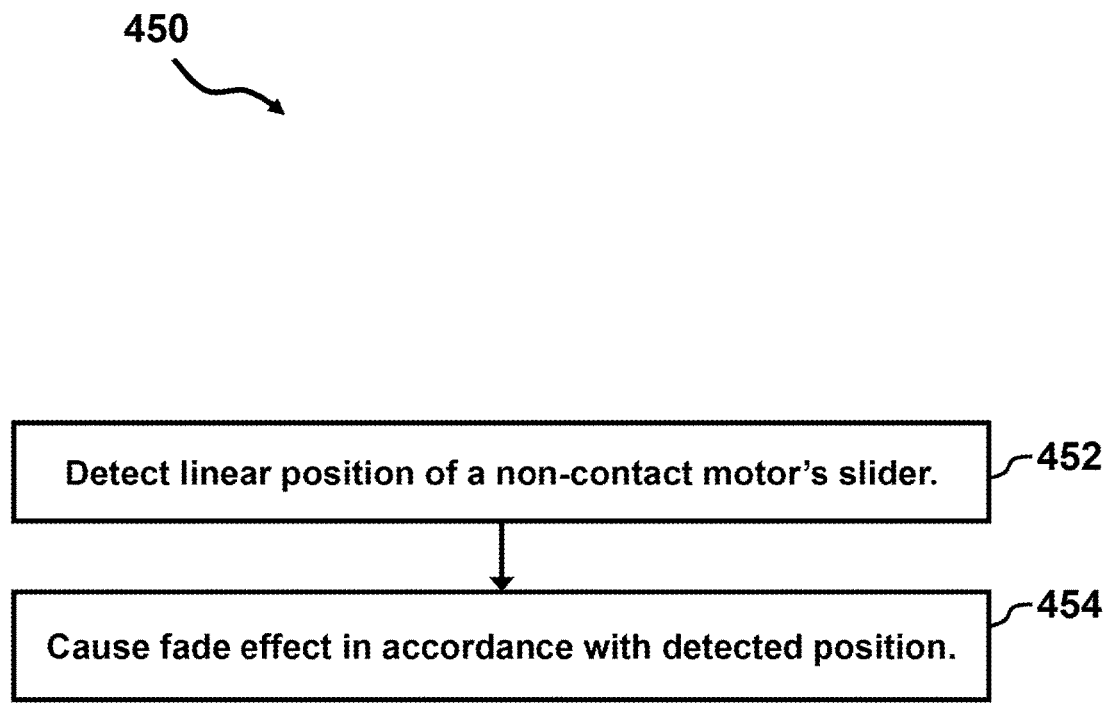
FIGS. 6-12 are flowcharts of processes for operating a linear fader according to illustrative embodiments.

FIG. 6 is a flowchart for a method 450 performed by a linear fader in accordance with an illustrative embodiment. At block 402, a linear position of a non-contact motor's slider is detected. For example, the Hall effect sensors 204 can be used to detect the position of the magnets 107, 207 along the length of the linear fader 400, 401. At block 404, a fade effect is caused in accordance with the detected position. For example, if a linear fader is used to adjust the volume of a frequency, the position of the slider 100, 200 can be indicative of the volume to be used. For example, if the slider 100, 200 is at the top of the linear fader 400, 401, then maximum volume of the frequency should be applied. Following such an example, if the slider 100, 200 is at the bottom of the linear fader 400, 401, then minimum volume of the frequency should be used. In alternative embodiments, any other fade effect can be used.

Figure 7:
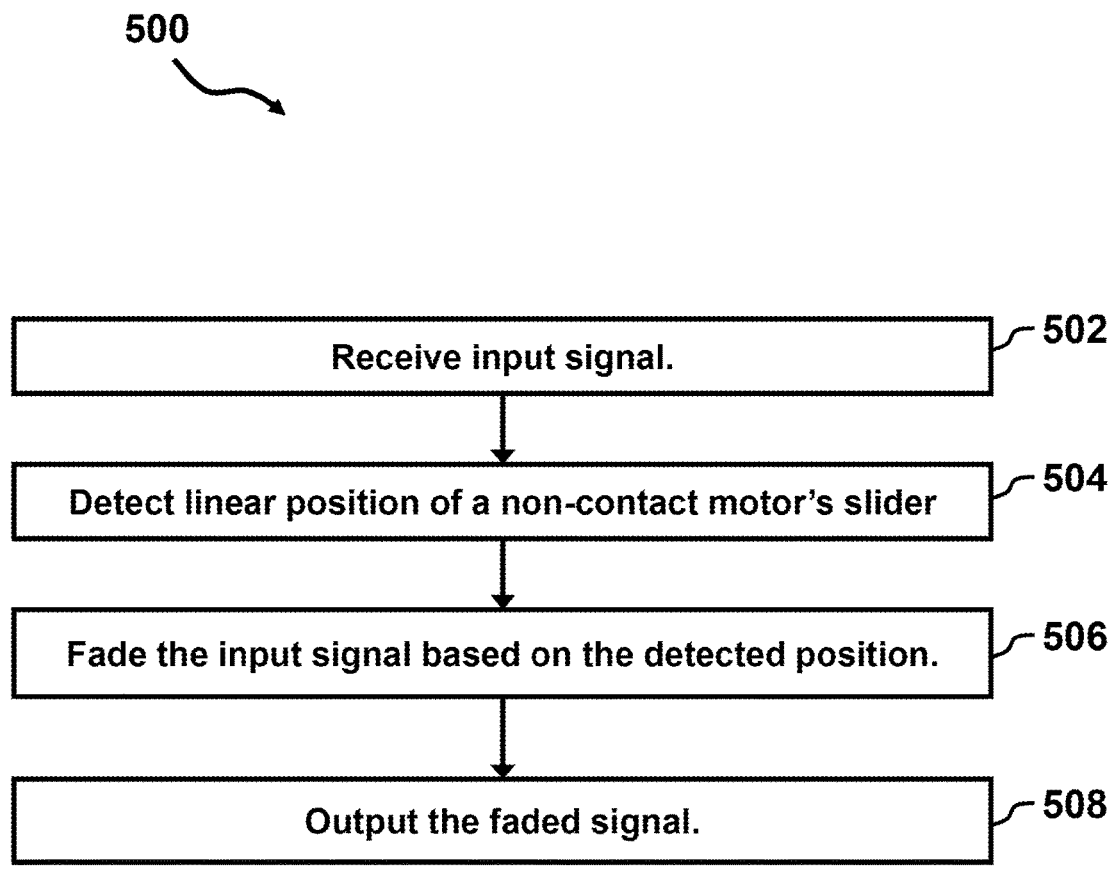
Figure 8:
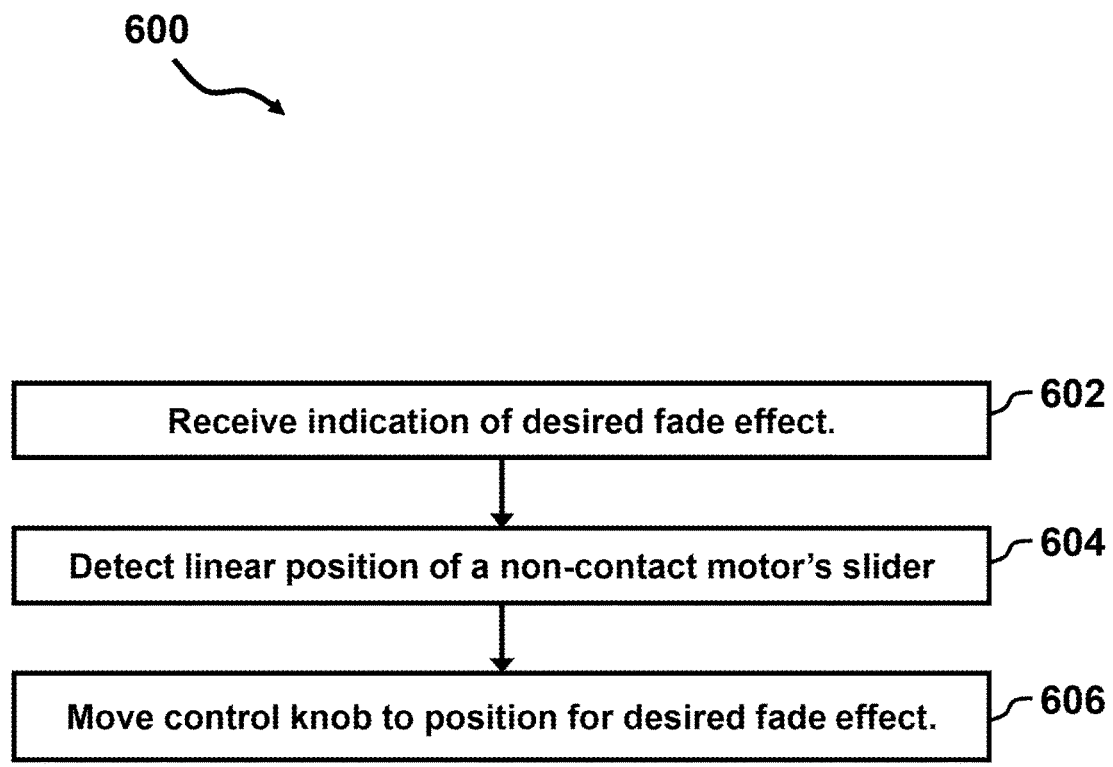
Figure 9:
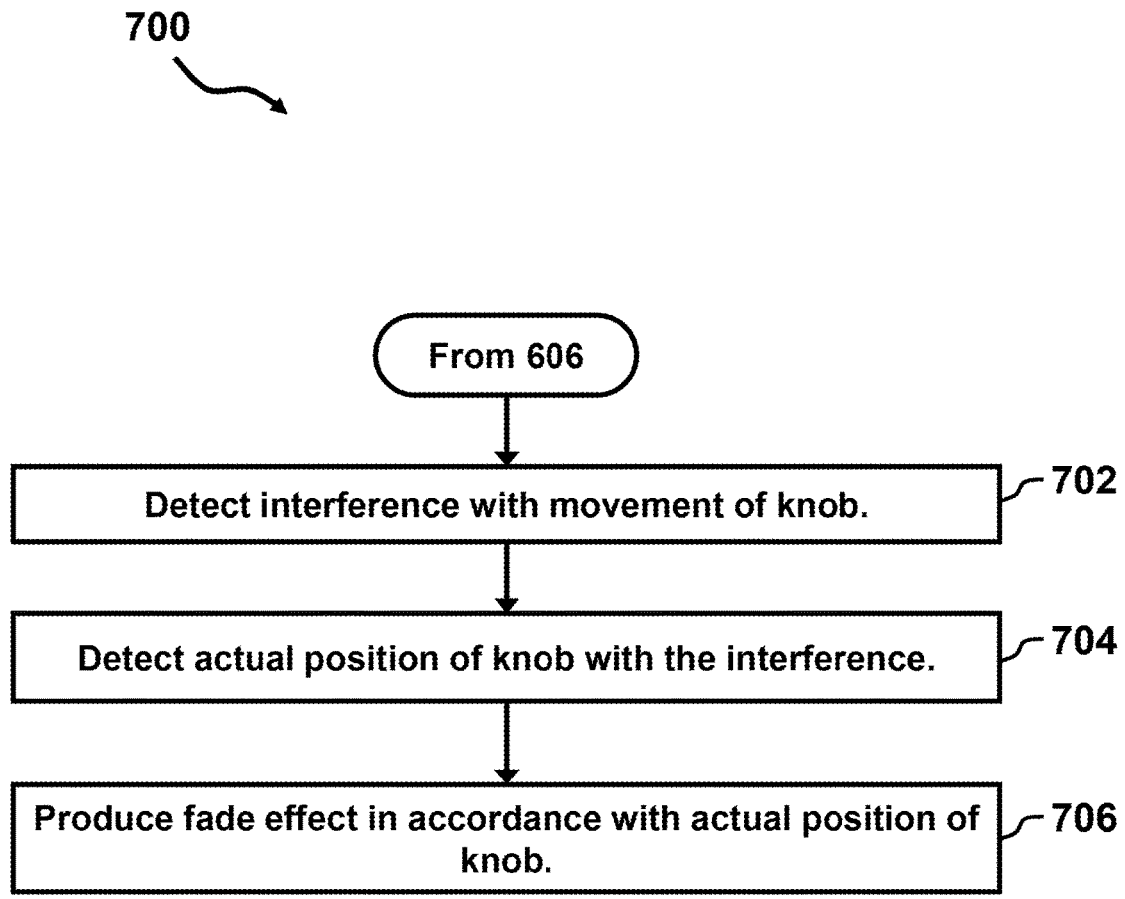
Figure 10:
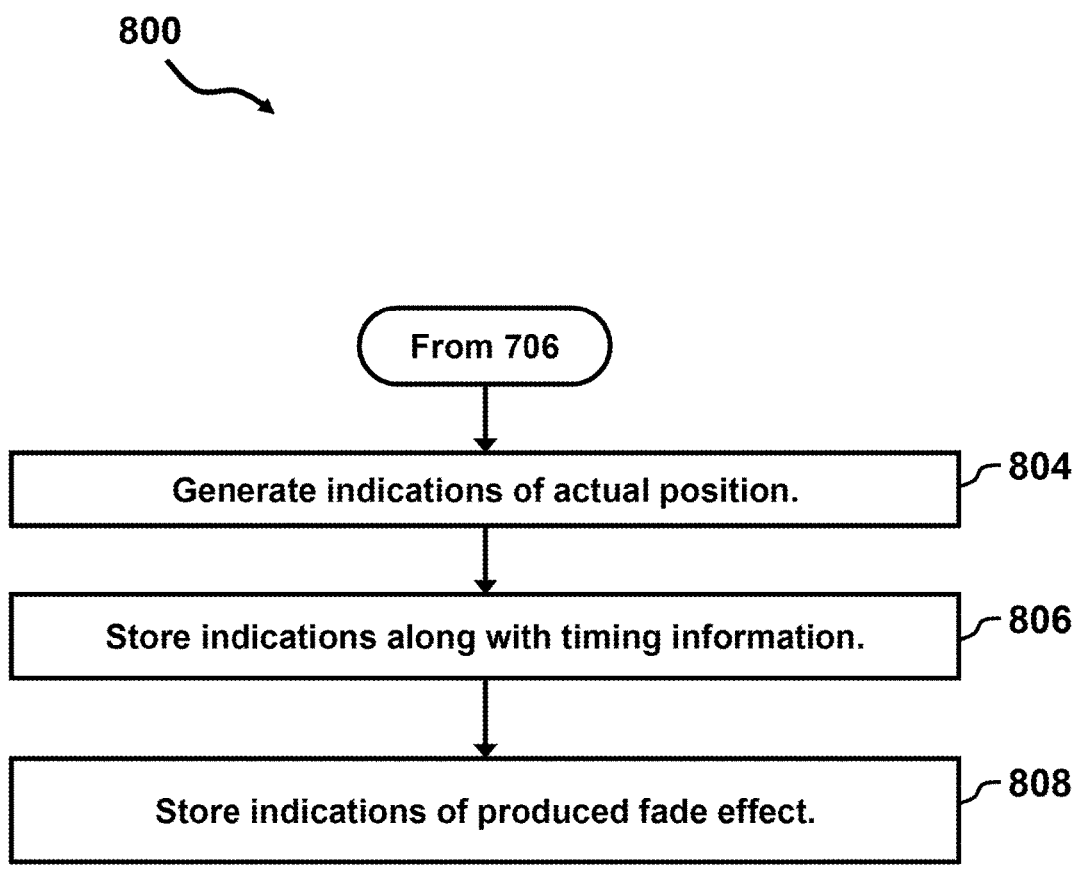

FIG. 7 is a flowchart of a method 500 performed by a linear fader in accordance with an illustrative embodiment. At block 502, an input signal is received. For example, block 502 can include receiving the input signal 316. In some cases, the input signal 316 may be stored in the electronic storage 304 of the linear fader 300, 400, 401 and received by the processing elements through the bus 314. In other embodiments, the input signal 316 may be received via the communication interfaces 312 from local or remote sources. The input signal 316 may be received in any format or encoding and, therefore, may be translated or reformatted by the linear fader 300, 400, 401 (or an element communicatively connected to the linear fader) prior to being altered by the linear fader.

The input signal 316 may include any of various signal types. For example, the input signal 316 may include audio, video, electrical current, optical, and/or visual signals, in addition to other signal types. In some cases, multiple ones of the input signal 316 may be received and altered by the linear fader 300, 400, 401.

Similar to the method 450, the method 500 can include block 504 which includes detecting a linear position of the non-contact motor's slider and block 506 which includes fading the input signal based on the detected position. For example, if four linear faders 300, 400, 401 are each assigned a respective audio signal, and the four audio signals are to be mixed together, the linear faders may assign a translational position of the linear fader to a gain (or level, etc.) for the respective signal so that the user may move the linear faders with respect to the assigned position when the user desires to alter the respective signal (or level of the respective signal in a mix of the four audio signals) associated with the position. As another example, the linear fader 300, 400, 401 may be used to mix together two audio signals by assigning a direction of translation to each signal so that a user may make one signal more prominent than the other by moving the fader control knob 102 in the direction assigned to the desired signal, and vice versa. The linear fader 300, 400, 401 may also receive signals that combine more than one type of media (such as a corresponding audio and video signal for a single scene) that are to be faded jointly or separately. Signals may be received all at once and then edited using the linear fader 300, 400, 401 or the signal may be streamed to the linear fader one piece at a time.

At block 508, an output signal is transmitted. In an illustrative embodiment, the output signal is a signal that has been faded according to some set of procedures. The output signal, such as the output signal 318, may include all of the features discussed above with respect to the input signal 316. For example, the output signal 318 may be any of the signal types and may include multiple signals or a single signal. The output signal 318, in some embodiments, may include a different number of signals than the input signal 316 (e.g., because the signals are mixed together into fewer signals). However, the output signal 318 may include media types equivalent or substantially equivalent to the types of the input signal 316. The output signal 318 may be transmitted in the same way that the input signal 316 is received and may be processed after being faded, for instance, to comply with formatting or encoding requirements.

At blocks 402, 504, and 604, methods 450, 500, and 600, respectively, include detecting the linear position of a non-contact linear motor's slider. Block 704 of method 700 includes detecting a position of the fader control knob 102. As described above, the detection of the position of the slider 100, 200 and the position of the fader control knob 102, 202 may be performed by various sensors and/or devices. Although the position of the slider 100, 200 may be directly detected as the slider position and/or the position of the fader control knob 102, the detected position may be considered a single knob/slider position because of the direct connection between the fader control knob and the slider. In embodiments where some or a significant amount of flexing, bending, or gap allows the position of the slider 100, 200 to be significantly different from the position of the fader control knob 102, the linear fader 300, 400, 401 may detect one position and use the detected position as the position of interest for the linear fader.

In some embodiments, position detection (e.g., of the slider 100, 200 and/or the fader control knob 102, 202) may be performed on a periodic basis (e.g., once a minute, 10 times per second, 20,000 times per second, etc.) to provide a set of position values ranging in specificity from very occasionally to real-time streaming. In other embodiments, the position detection is only performed in response to particular stimuli (e.g., motion detected, contact of the user with the fader control knob 102, 202, input audio signal detected, both input and motion detected, etc.). In still other embodiments, the detection may be performed on a passive basis, with the linear fader 300, 400, 401 constantly detecting position information, even when the information is not being used. Additionally, in some embodiments, the linear fader 300, 400, 401 may combine both periodic and responsive detection processes to yield a more complete result. For instance, the periodic position detection may start with a first rate when neither user presence nor an input signal is detected, and then increase to a second, faster periodic rate when one or both of these stimuli are detected.

At blocks 404, 506, and 706, the methods 450, 500, and 700, respectively, include producing a fade effect in accordance with a detected position of the slider 100, 200 or the fader control knob 102. The fade effect may be any signal processing that is tunable by the linear fader 300, 400, 401. For example, if the input signal 316 is an audio signal, the fade effect may alter the amplitude, frequency, phase, timbre, echo, sampling characteristics, speed, equalization, reverb, reverse echo, noise properties, carrier wave dynamics, or beating of an input audio signal, in addition to various other techniques and characteristics. As another example, if the input signal 316 is a video signal, then the fader effect may facilitate changing the spectral characteristics, coherence, brightness, tone, sharpness, contrast, sampling rate, density, proportion, or position of the video signal. In another example, if an electrical input signal is applied to the linear fader 300, 400, 401, then the fade effect may change the voltage amplitude, current amplitude, voltage frequency, waveform, phase, current frequency, dispersion, or DC offset of the signal. For other types of the input signal 316, different fader qualities may be used. In some embodiments, a "fader" may only be considered an audio fading device. In other embodiments, the "fader" may be limited to a single different application.

The altered property of the input signal 316 may be either discrete (i.e., varying at a certain number of perceptible levels) or continuous (i.e., varying at a near-imperceptible fineness between levels, rather than conforming to larger discrete levels). For discrete properties, each level of the varied property may be associated with a particular range of linear positions. For example, if the altered property only has a single value representing an "on" state and a single value representing an "off" state, then the linear fader 300, 400, 401 may (i) designate a central linear position, (ii) turn off the fade effect when the slider 100, 200 is moved downward from the central position and (iii) turn on the effect when the slider 100, 200 is moved upward from the central position. As another example, if the altered property of the input signal 316 may only vary at ten particular levels, then a certain range of movement (for example, one full electrical phase) may be divided into ten ranges, with the range in which the slider 100, 200 is positioned being used as a trigger for activating one of the levels of the property.

For continuous properties, the program instructions 306 or circuitry may associate the property value with the linear position in accordance with some mathematical function. To determine such associations, the linear fader 300, 400, 401 may receive an indication (or calculate from known system limitations) of the maximum and minimum levels of the fade effect that may be produced by the linear fader. For example, if the faded property is signal amplitude and the input signal 316 is represented by an analog electrical voltage, then the maximum value of the linear fader 300, 400, 401 may be the highest voltage attainable (e.g., the saturation level of the operational amplifiers in the linear fader) and the lowest value may be the lowest measurable voltage (e.g., the turn-on voltage of the transistors). In such an example, the linear fader 300, 400, 401 may generate a range-scaling formula that associates the potential range of values to the range of some linear position arc (e.g., either predetermined or dynamically allocated). Continuing the analog amplitude example, if the linear fader 300, 400, 401 designates a preset displacement of the fader control knob 102 (i.e., 40 mm) as the movement range, then the scaling formula may be determined by taking a template function and assigning the scalars so that the minimum analog voltage is associated with some zero position and the maximum level is associated with a position 40 mm beyond the zero position, in the direction designated for increasing amplitude (e.g., upward). In such an example, when the linear fader 300, 400, 401 is producing the fade effect, the linear position may be fed into the scaled function and the level of fading for the property may be taken from the result of the function.

In some embodiments, a continuous property may be cast as a discrete property by assigning a smaller number of levels to the linear fader 300, 400, 401. For example, an analog amplitude level may be converted to a digital signal during processing, such that only the discrete digital levels are representable. However, in such an embodiment, the number of discrete steps may be chosen so that the stepping is imperceptible to a user. In other embodiments, a continuous variable may be divided into perceptibly large levels to be controlled by the linear fader 300, 400, 401.

In some embodiments, the fade effect may be produced continuously while the input signal 316 is being received. For example, one or more audio signals may be continuously changed to allow a user to hear the effect of changes made to the signals, either independently or mixed together, or alternatively, to see the effects to a visual signal, while the effects are being tuned. In other cases, the fade or mix effect may be performed only when detected user-interactions indicate an intent to alter the signal. For example, the fade effect may only be activated while a fade-on switch is actuated. As another example, the presence of a user's hand on the fader control knob 102 may be detected (e.g., by heat, proximity, pressure sensors, etc. on knob 102) and used as a trigger for turning on or off the fade effect. In another aspect, the duration of a fade effect may be specified prior to the input signal 316 being fully received, presented to the user, or cued up for fading. For example, when a user finds a certain "sweet spot" of fading for a track or signal, the user may assign that fading level to the input signal 316 for a time range after or before the portion of the signal that is currently being presented to the user (e.g., the rest of the track or the whole track, including preceding and forthcoming portions). In particular, the linear fader 300, 400, 401 may record an indication of the part of the input signal 316 that was presented when the fade-effect begins to be altered (e.g., fader control knob 102 is moved) and, once an acceptable level is attained, use that level (with a reasonable build-up) for a range of time that begins at the indicated part of the signal.

At block 602 of the method 600, an indication of a desired fade effect is received. In this and other contexts herein, the term "desired" is used as an indication of a prescribed, intended, or selected condition or level that is to be produced by the apparatus. However, the term should not be interpreted as requiring actual desire or want on the part of a user, artist, viewer, or other entity. Rather, the "desired" state of an apparatus is the state that the apparatus is being controlled to produce, whether or not that state is desired or expected by a user or operator.

In the context of the block 602, the desired fade effect may be a stored (e.g., stored in the electronic storage 304, and/or a database in communication with the linear fader 300, 400, 401) fade-effect level that the linear fader 300, 400, 401 has been instructed to produce. In some embodiments, the stored level may be a fade level that was previously tuned by a user of the linear fader 300, 400, 401 or a connected system. For example, the linear fader 300, 400, 401 may record a sequence of fade effects that a user tunes while the track is being recorded. The user may then play the track back including the sequence of fade effects. Therefore, the fade effect levels may be recorded as a level (or a position of the control knob associated with that level) along with a corresponding timestamp for the range over which the level is applied (or indications of which portion of the signal is contained in that range). Then, in reproducing the input signal 316 with the added effects, the linear fader 300, 400, 401 may synchronize the recorded sequence of fade levels with the received input signal to produce the playback. Such a process may be useful so that the user may further fine-tune the fade effects upon hearing the playback.

As with other signals, the desired fade level (e.g., control input 320) may be received by a component of the linear fader 300, 400, 401 via any of various interfaces, connections, and protocols. In some embodiments, the received control input features only the desired levels and timing signals. In other embodiments, the linear fader 300, 400, 401 may receive slider position specifications with the timing information, rather than an indication of how the slider position affects the signal. In still other embodiments, the control input 320 may be received as levels of stator current that are capable of moving the fader control knob 102 to the desired position. Further, some control signals may be generated in a processing system, either in the fader or coupled to the linear fader 300, 400, 401, which receives the input signal 316. For example, the processor 302 may be configured to recognize specific patterns in the input signal 316 and, in response to recognizing the pattern, automatically tune the linear fader 300, 400, 401 to a particular level. Such a recognizable pattern may be a volume range, a frequency range, a change in volume or frequency, a frequency profile, or a change in frequency profile, and may be detected by a signal processor in a processing system. In a mixing application, the linear fader 300, 400, 401 may be programmed or configured to respond to patterns in one or both tracks (including patterns in comparisons, correlations, or other aggregate features) and alter the fade effect on each track in accordance with the pattern recognition. In this way, dynamic changes detected in one track may be used to change the fade levels in another track.

At block 606, the method 600 includes moving the fader control knob 102 to a position associated with the desired effect. In an example embodiment, the linear motor may be used to provide a linear force to the slider 100, 200 along the rail(s) 104 to control the fader control knob 102. To do so, an electrical current of varying phase may be applied to the stator coil arrays 208 of the stator-support unit of the linear fader 300, 400, 401. In an illustrative embodiment, a three-phase current may be input into the stator coil arrays 208 of the stator-support unit in such a way that the induced magnetic fields either oppose or attract portions of the slider 100, 200 in the desired direction. When the slider 100, 200 achieves a magnetically-stable position, the current may be changed so as to move the slider 100, 200 to a new stable position. In minimizing potential energy for the linear fader 300, 400, 401, the slider 100, 200 may then follow the stable position in an electrically controllable pattern. Thus, the linear fader 300, 400, 401 may move the fader control knob 102 to any position by changing electrical current impulses through the stator coil arrays 208. To increase the precision or stability of knob positioning, various monitoring/regulating mechanisms may be used on the control signal, such as proportional-integral-derivative (PID) controllers or other feedback systems.

In at least some embodiments, the linear position control of the slider 100, 200 may be changed by the system using open-loop or closed-loop mechanisms. For example, in an open-loop mode, a drive vector of sufficient magnitude to move the slider 100, 200 may be applied to the stator coils 208 of the stator-support unit. By virtue of applying the drive vector, the slider 100, 200 may move such that the magnetic phase of the slider 100, 200 is in alignment with the drive phasor. On the other hand, in a closed-loop mode, variants of proportional, integral, and derivative (PID) control may be applied with tuning constants such that a position of the slider 100, 200 may be driven in a rapid and stable trajectory. In some 3-phase embodiments, power efficiency may be improved by driving the magnitude and phase for currents in the stator coils 208 via closed-loop control such that the inferred physical angle $\varphi$ tracks or remains locked to either $+/-90$ degrees with respect to the inferred physical flux angle $\theta$ based on the position of the slider 100, 200. In at least some embodiments, a combination of the open-loop and the closed-loop modes may be implemented.

In an illustrative embodiment, the linear fader 300, 400, 401 uses the received desired fade effect from the block 602 as a controlling input for determining to which position to move the fader control knob 102. For example, if the desired effect was recorded as a user-input to the linear fader 300, 400, 401 (either in the same linear fader or a different linear fader setup), then the fader control knob 102 may be moved to a position that is roughly the position of the fader control knob when the effect was first recorded. In another example, the linear fader 300, 400, 401 may determine positions that may be associated with the desired fade-effect either by assigning discrete fade levels to particular position ranges of the slider 100, 200 and/or the fader control knob 102, or by generating a function that associates a given amount of fade with a mathematically calculable position. In another example, the linear fader 300, 400, 401 may be configured to react to the movement of another fader, so that one or more faders may mirror, track, or invert the movements of another. Once the controlling function (either discrete or continuous) has been generated, the sequence of desired fader levels may be converted to a sequence of slider positions and used to move the slider 100, 200 and the fader control knob 102 to the positions associated with the desired effect(s).

As noted above, one use of such an automated playback of fader levels is to facilitate changes to the fade level based on newly detected user-input. Accordingly, block 702 of the method 700 includes detecting interference (e.g., by a user) with the movement of fader control knob 102. In context, the movement of the fader control knob 102 is induced by the current in the stator in the linear motor in accordance with a desired fade level. For example, a user-interference of the movement may be an indication that the fade level should be changed in the recorded sequence of fade effects. Hence, the user-interaction may be treated as overriding, so that the fade effect that is played by the linear fader 300, 400, 401 may be associated with the position that the linear fader is actually occupying, rather than the recorded fade level. To ensure that the user is able to interfere effectively, the force of the linear motor may be relatively weak in comparison to a user's strength. In some cases, this may be achieved by applying a relatively low force to the linear motor. In other embodiments, the linear fader 300, 400, 401 may detect the presence of a user-hand in proximity to the fader control knob 102 and, in response, temporarily lower the force applied to the linear motor.

Further, because the user-interaction may indicate that the recorded fader level is to be changed, an example method 800 may include generating indications of the actual position of the control knob (block 804) and storing those indications along with timing information associated with the actual positions (block 806). In some cases, the new fade-effect levels or fader positions may be stored in databases in place of the original fade levels (i.e., over-writing the original recorded sequence of effects). In other cases, the new fade effects may be recorded in a separate sequence of fade effects (e.g., along with the original fade effects whenever the user did not interfere with the levels). In addition to storing the position information for the slider/knob, the system may optionally also record indications of the fade effect that was produced by the fader in accordance with the new position (block 808).

In another aspect of the present disclosure, the fader control knob 102 that is tied directly to the slider 100, 200 may facilitate producing a unique "feel" for the movement of the fade control knob. As discussed above, the gears, pulleys, connections, and linear motor friction of traditional linear faders may cause the linear faders to feel coggy or gritty. However, by connecting the fader control knob 102 directly to the slider 100, 200 of the linear fader 300, 400, 401, a majority of the physical feel of the linear fader 300, 400, 401 may be removed (or controlled). Therefore, without any force added by the slider 100, 200, the fader control knob 102 may glide easily with very little friction, cogginess, or grittiness when moving. It should be noted that the slider 100, 200 may be part of a non-contact linear motor that may still use some structures that make contact with the rail assembly for mechanical support. However, such structures may be very low friction (e.g., through bearings, lubricants, coatings, rollers, etc.) so as to be imperceptible to a user.

In some instances, it may be desirable to add some force by the linear motor in order to improve the way that the fader control knob 102 feels when moved. Accordingly, the force of the linear motor (in either direction) may be utilized to oppose movement of fader control knob 102 in order to produce a particular feel effect. For example, in one implementation, the linear motor may be configured to provide force that resists all movement of the fader control knob 102 by generating a certain opposing force on the fader control knob (which could, potentially, be relatively small). In this way, a user may feel that the fader control knob 102 is being resisted in a natural way. That is, the feel of moving the slider of a traditional linear fader may be replicated using the non-contact linear faders of the present disclosure. In addition to providing a single continuous level of force, the linear motor may 200 alternatively provide force to cause the force applied to the fader control knob 102 to vary with time, speed of movement, or position so that force feels more natural and less manufactured than a continuous, never changing force. For example, a viscous feel may be provided when a small amount of force is applied in opposition to the direction of movement, in proportion to the speed of movement.

For example, a variable viscous component to the tactile feel of the fader control knob 102 may be desirable for preventing abrupt movements and improving the ability of a user to more accurately fine-tune. The non-contact nature of the stator-support unit and the slider-knob unit, as discussed above, may facilitate a viscous feel effect. In addition, dampers, whether mechanical, electrical (e.g., via magnetic coupling), or a combination of electrical and mechanical, may be added to achieve a viscous feel effect. In at least some embodiments, the term "viscous" or "viscosity" may be defined as a resistance/force proportional to movement. An estimate for velocity may be used to produce a viscous feel by adding a force component in opposition to the direction of movement of the slider 100, 200, in proportion to the speed thereof. Particularly, the velocity for enhancing the feel of the control may be based on taking differences between Hall sensor samples with reference to the number of samples between them, and filtering to mitigate the effects of noise and producing a digital velocity signal.

In some embodiments, provided force on the fader control knob 102 by the force on the linear motor may even include negative force (i.e., the linear motor pushing in the direction of movement). However, the very low friction of the linear fader 300, 400, 401 may make such force unnecessary in many applications.

Figure 11:
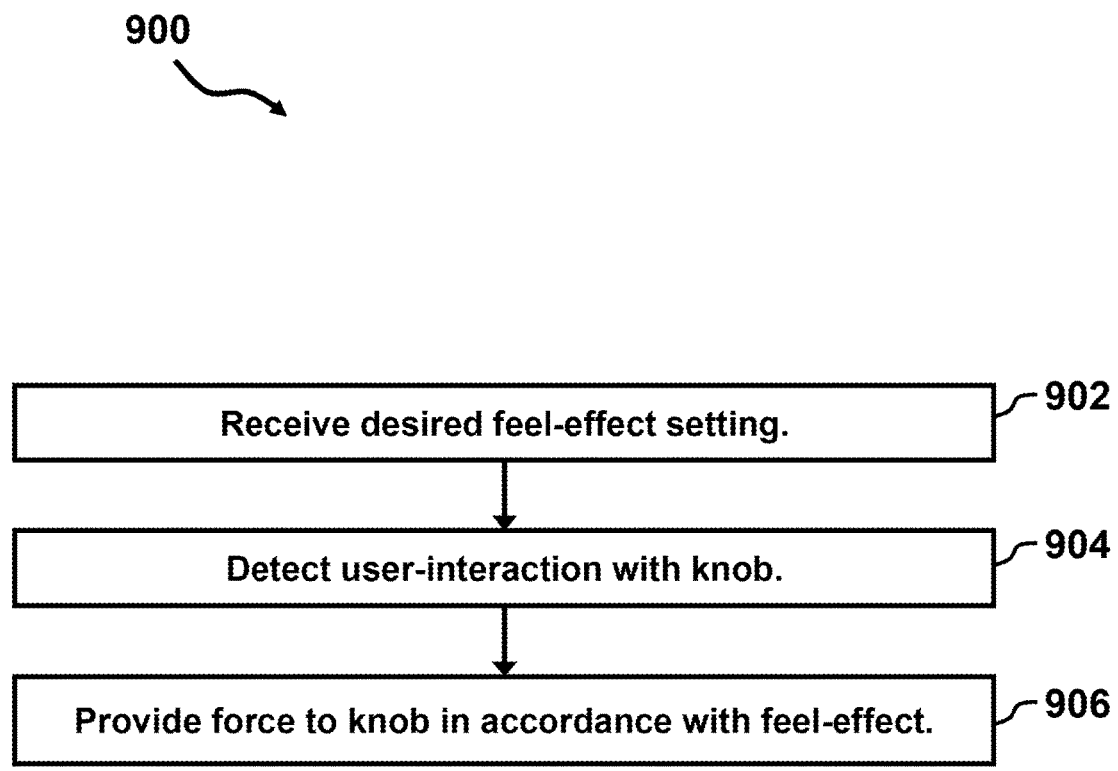
Figure 12:
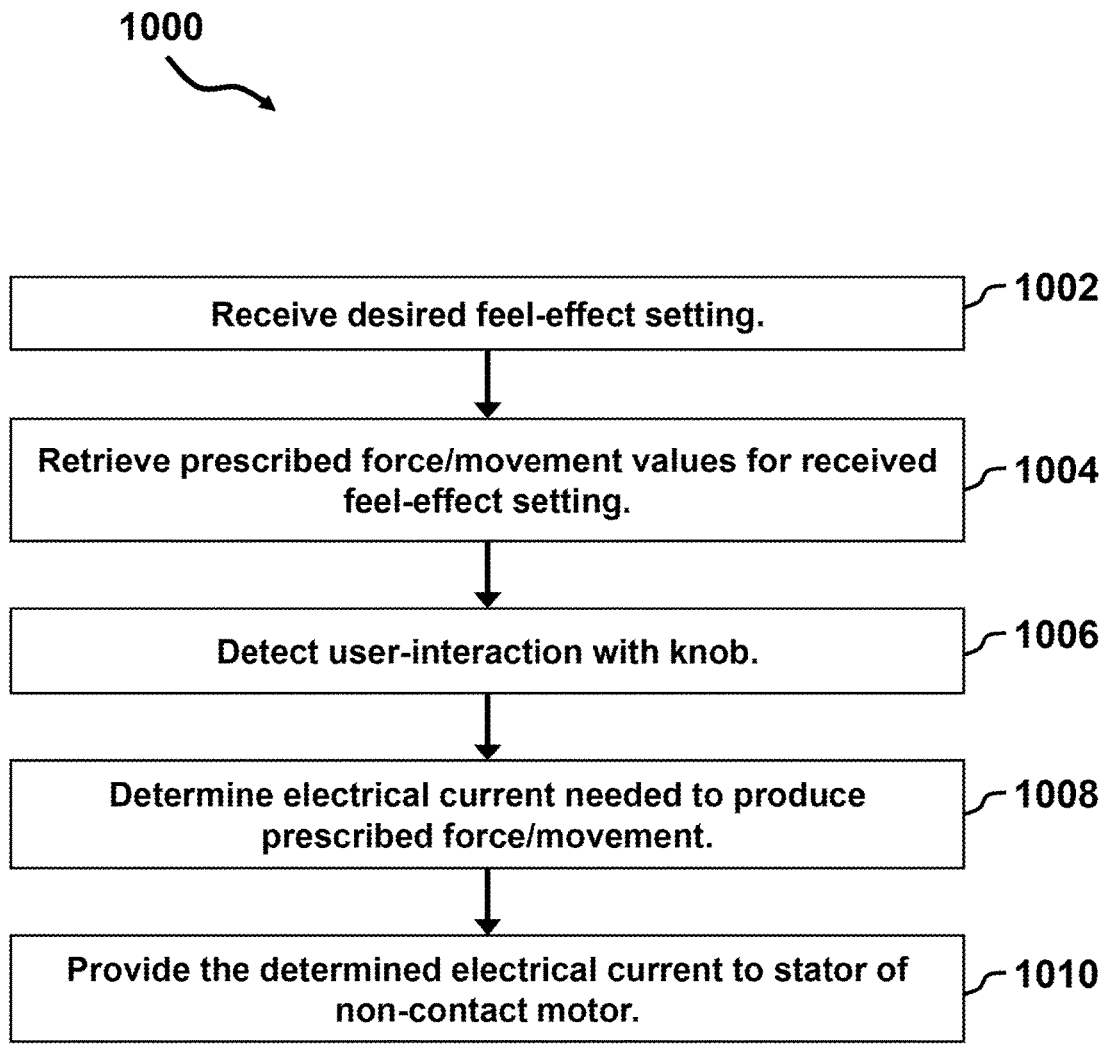

Turning now to FIGS. 11 and 12, methods 900 and 1000 show example procedures that may be used in producing such feel effects. As shown, the methods 900 and 1000 involve receiving a desired feel-effect setting at blocks 902 and 1002, respectively. The feel setting may be instructions for producing the desired feel-effect or the feel setting may provide a label for the feel-effect, for which procedures may be located through, for example, reference to a hash table that includes feel labels and associated procedures (block 1004). At blocks 904 and 1006, the methods 900 and 1000 involve detecting user-interaction with the fader control knob 102. Because the feel-effect may relate to the way the fader control knob 102 feels in motion, the linear fader 300, 400, 401 may benefit from detecting the presence and characteristics of the user-interaction. In particular, some procedures may include different force values for different speed or acceleration values for the fader control knob 102. For example, if the desired feel-effect includes an indication of a desired level of perceived inertia for the fader control knob 102, then more force may be applied to the linear motor in response to a larger acceleration. Such force values may be calculated in accordance with the physical laws that govern the motion of objects with the particular inertia that is to be perceived.

Other feel effects may include the perception of friction, viscosity, virtual mass, stabilization (e.g., with PID or other feedback), a programmable texture, superposition, buzzing, artificial (or simulated) end-stops (e.g., the artificial end-stops can precede mechanical end-stops at the limit of travel for the slider 100, 200), notches, notch density, notch depth, moving notches, changing notches (to appear or disappear), an audible "tick" produced by pulsing the linear motor to simulate a metallic mechanical stop, and a simulated spring load (substantially arbitrarily applied/simulated over any given range for the position of the fader control knob 102). As one example, a buzzing may be used to indicate that a limiting state has been reached by the linear fader 300, 400, 401 or that some problem is occurring. For instance, the buzzing may occur when the linear fader 300, 400, 401 is set too high. Buzzing or other tactile responses may also alert the user to changes or issues with the incoming signal (e.g., signal level too high, signal is garbled, signal has ended, etc.). Similar tactile feedback may be provided to alert a user about any of various state changes in the signal, the linear fader 300, 400, 401 or another connected component (e.g., an audio mixer).

Some of the feel effects may fit into a category of "haptic" feedback, in which the force is perceived as a mechanical artifact of the linear fader 300, 400, 401 although the artifact is actually produced by electronic linear motor controls. For example, the linear fader 300, 400, 401 may simulate the feel of notches at different linear positions by resisting movement away from the set of stable positions associated with the notches, while providing less opposition to movement between notches. Because the notches may be virtual, however, the notches can be moved and altered in location, number, and perceived depth (e.g., the amount of opposition to movement away from the stable positions) depending on system state, as discussed above. As another example, a mechanical "tick" sound, coupled with an end-stop (e.g., a positional threshold beyond which any further movement is greatly resisted by the linear motor), may provide the perception of the fader control knob 102 encountering a mechanical barrier at the end of the fader control knob's movement path. As a further example, a spring-loading effect may be produced by providing a unidirectional (in one linear direction but not the other) force to the fader control knob 102 that may increase as the fader control knob moves away from a particular stable position. As still another example, a small buzz may be provided when the linear fader 300, 400, 401 is moved in a translational manner, to communicate that movement has been recognized and make the movement feel more realistic.

In at least some embodiments, current in the linear motor (e.g., current through the stator coil arrays 208 of the stator-support unit) may be set to zero when the desired feel effect involves no user interaction with the fader control knob 102 and/or when the fader control knob is not being driven to a new position. Such a temporary disabling of the linear motor may extend the power/battery life of the linear motor. Furthermore, the linear fader 300, 400, 401 may be designed such that the haptic features, discussed above, may instantly or substantially instantly turn on (e.g., faster than a human may perceive) the linear motor upon touching the fader control knob 102. Such tactile sensing of the fader control knob 102 to move the linear motor on may be accomplished by using capacitive coupling and/or by sensing minute fluctuations in the Hall-sensor outputs, as discussed above. Fluctuations determinable by the Hall-sensors may occur due to vibrations that may be caused by the presence of the user's fingers on the fader control knob 102.

Therefore, such power saving features may be used to extend the battery life of the linear motor and/or reduce power consumption of the linear fader 300, 400, 401. These power saving features may also be beneficial in reducing electromagnetic emissions (EMI emissions). Specifically, the motor driver chips responsible for providing pulse width modulated (PWM) signal(s) to each phase of the motor may be disabled, thereby setting PWM outputs to the linear motor to a high-impedance state, whenever the fader control knob 102 is not being touched by the user or being driven to a new position. In at least some embodiments, the motor driver may be a Texas Instruments motor driver model number DRV8312, although other motor drivers are contemplated and considered within the scope of the present disclosure.

Once disabled, the fader control knob 102 may essentially be considered released, held only by a bearing/bushing friction. The speed of de-activation or re-activation may be accomplished at a sufficient speed so as to render the de-activation/re-activation substantially imperceptible by the user, even when actively using the haptic features. Further, if the motor 200 drives are used to stabilize (e.g., hold steady) the fader control knob 102 in response to movement or vibration of the linear fader 300, 400, 401 itself, the linear fader may also be disabled if/when the linear fader is not subject to any form of significant motion/disturbance.

Depending on the implementation, there may be other chips that may also be turned off, such as power supplies, digital signal processors (DSPs) (in a multiple DSP system, where one DSP monitors all Hall sensors) or even the bias current feeding the Hall sensors if an alternative means of sensing touch (such as capacitive touch) is present.

In an illustrative embodiment, three illustrative methods may be used to detect touch/motion. In the first method, small displacements detected via the Hall sensors can be used. Such a method may be useful to detect the presence of user interaction with the fader control knob 102 or displacement or movement/error with respect to a desired position. In the second method, a capacitive touch sensor on the fader control knob 102 can be used. In the third method, sensors may be placed for the measurement of acceleration or velocity in the linear fader 300, 400, 401 itself. Other methods to detect touch/motion may include using infrared reflection or ultrasonic proximity detection for sensing the presence of the user's hand/fingers near or on the fader control knob 102. Such infrared reflection or ultrasonic proximity detection techniques may also advantageously provide some advance notice to the user as the user's hand/fingers approach the fader control knob 102. In other cases, a small amount of back-EMF (or induced back-electromotive force) may be used to detect motion of the slider 100, 200.

Other haptic, mechanical-mimicking, or other feel effects are contemplated in the present disclosure, although not mentioned specifically. Once the user-interactions are being tracked and the force for the feel effect has been calculated (block 1008), the linear fader 300, 400, 401 may apply force to the slider 100, 200, thereby providing a simulated feeling of resistance to the fader control knob 102 (block 906). Since some user-interactions are quick and unexpected, the linear fader 300, 400, 401 may maintain a certain opposition to motion, even when the fader control knob 102 is stopped and not moving. Additionally, the force may be provided as a circuit-based (i.e., rather than computer based) feedback loop, with the force being the input, and the detected slider position being the output and feedback quantity. In any case, the force may be applied by sending electrical current through the stator coils 208 (block 1010).

In an illustrative embodiment, the feel of an end-stop once the user forces the fader control knob 102 past the end-stop may be enhanced by adding a viscous component. This viscous component differs from the viscous feature described above. Such a reduction of the momentum of the fader control knob 102 may allow for an easier control of the fader control knob and a reduced overshoot into the non-end-stop region upon the return of the fader control knob. Furthermore, in at least some embodiments, the feel of the end-stops of the fader control knob 102 may be enhanced by deactivating all other features when within approximately a few tenths to a few-hundredths of an electrical phase prior to reaching the end-stop. Such a deactivation procedure may have an effect of making the electrical end-stop (with limitation on the available force) appear/feel more dramatic.

Figure 13:
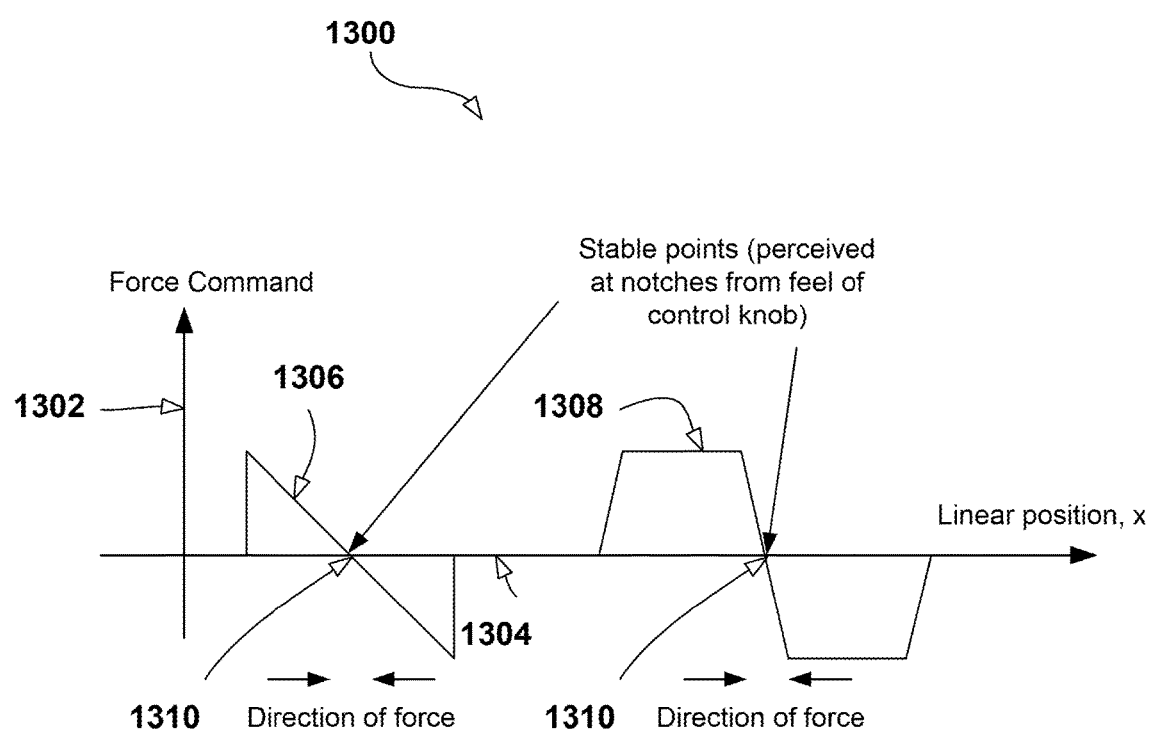
FIG. 13 is a waveform illustrating the creation of perceived notches on a fader control knob according to an illustrative embodiment.

FIG. 13 is a waveform illustrating the creation of perceived notches on a fader control knob according to an illustrative embodiment. Referring to FIG. 13 in conjunction with FIG. 4A, an illustrative graphical illustration 1300 of a force waveform as a function of a sensed position of the slider 100, 200 is shown, in accordance with at least some embodiments of the present disclosure. The graphical illustration 1300 plots a force command on Y-axis 1302 against a linear position of the slider 100, 200 on X-axis 1304. The graphical illustration 1300 further shows two illustrative notches 1306 and 1308, each having a stable position 1310. Specifically, the notches 1306 and 1308 may be created by generating a current vector, as explained above, to create a force pattern as a function of sensed position of the slider 100, 200 based upon feedback from the Hall-sensors. Such a force pattern may create the stable position 1310 in each of the notches 1306 and 1308. Furthermore, the shape of the notches 1306 and 1308 may determine the characteristics of those notches. For example, the notch 1308 may have a wider range compared to the range of the notch 1306. Similarly, the spacing between the notches may be decreased or increased by altering the shape or position of those notches. Characteristics of these notches such as perceived width, location and depth may be controlled by driving the slider toward the position of a notch depending on the sensed position of the slider.

Notwithstanding the fact that the graphical illustration 1300 shows only two notches (e.g., the notches 1306 and 1308) having specific shapes, in other embodiments, notches having various other shapes may be implemented. For example, in at least some embodiments, the notches may have a sinusoidal shape of the force against sensed position curve. In some embodiments, by custom defining the notches 1306 and 1308, a family of configurable notches (also referred to herein as configurable detents) may be created where the slider 100, 200 may "stick" at closely spaced intervals. Further, the notches 1306 and 1308 may be programmable in terms of amplitude, width, density, and shape of the notch. In some embodiments, the notches 1306 and 1308 may be placed anywhere in a movement of the fader control knob 102 by defining the force waveforms as a function of sensed position (e.g., the notches 1306 and 1308) with no dependence on the configuration of the linear fader 400, 401.

Thus, the combination of the various features described may provide a more favorable result than merely the sum of the parts. In particular, the geometry of the linear fader 300, 400, 401 may allow the fader control knob 102 to be directly tied to the linear motor, without the use of gears, pulleys, etc. In combination with the linear motor, which is a non-contact linear motor, the fader control knob 102 may provide very little opposition to motion, which may be a greater reduction in opposition to motion than would be expected from the sum of the effect of these two features separately. Additionally, the low opposition to motion, either from one or both of the previous features, makes the haptic or "feel" effects reasonably pursuable by reducing the external frictional forces to the point that the linear motor-produced effects feel realistic. Further still, the other features (e.g., linear geometry, non-contact slider, direct connection between the fader control knob 102 and the linear motor, "feel" effects) allow for the motorization/automation of the linear fader 300, 400, 401 to be more efficient and natural-feeling than with traditional linear faders. It should not be construed that the features in this paragraph are the only novel features of in the present disclosure, or that such features are more important or preferable in an example embodiment. Rather, the example features are used to illustrate that the features of the present disclosure produce results that may not be expected by investigating each feature on its own. Therefore, the claimed systems and methods may not be reasonably interpreted as collections of separable elements, but as cohesive embodiments that provide inherent features not observable in the separate elements alone. However, various embodiments may incorporate only one or a few of the features described herein.

Additionally, various modifications to the embodiments described above are contemplated and considered within the scope of the present disclosure. For example, in at least some embodiments, coil arrays 208 may be arranged to face magnets vertically (top-down) rather than horizontally (left-right) on the slider 100, 200. Another modification may involve using an arbitrary number of arrays of coils and magnets along the axis of the linear fader 300, 400, 401.

The construction and arrangement of the elements of the systems and methods as shown in the illustrative embodiments are illustrative only. Although only a few embodiments of the present disclosure have been described in detail, many modifications are possible (e.g., variations in sizes, dimensions, structures, shapes and proportions of the various elements, values of parameters, mounting arrangements, use of materials, colors, orientations, etc.) without materially departing from the teachings and advantages of the subject matter disclosed.

Although the figures show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A linear fader comprising:
   a slider that is configured to slide along a rail, wherein the slider comprises a magnet;
   a plurality of coils spaced along a length of the rail, wherein a first portion of the plurality of coils is spaced along a first side of the rail, and wherein a second portion of the plurality of coils is spaced along a second side of the rail;
   one or more sensors configured to detect a position of the slider along the rail; and
   control circuitry operatively coupled to the plurality of coils and the one or more sensors, wherein the control circuitry is configured to:
      receive a first location of the slider from at least one of the one or more sensors;
      receive a signal corresponding to a desired location of the slider; and
      cause a first electrical current to pass through the plurality of coils, thereby generating a force on the slider in a direction toward the desired location.

2. The linear fader of claim 1, wherein the plurality of coils are configured in a three-phase arrangement, and wherein the first electrical current is a three-phase electrical current.

3. The linear fader of claim 1, wherein the control circuitry is further configured to:

receive a second location of the slider from at least one of the one or more sensors; and transmit, to an external circuit, a signal indicating the second location of the slider.

4. The linear fader of claim 3, wherein the signal indicating the second location of the slider comprises an indication of a fade effect to be applied to a signal corresponding to the linear fader.

5. The linear fader of claim 1, wherein the signal corresponding to the desired location comprises a signal attribute, and wherein the control circuitry is further configured to determine the desired location based on the signal attribute.

6. The linear fader of claim 1, further comprising a knob attached to the slider.

7. The linear fader of claim 6, further comprising a housing that houses the slider, the plurality of coils, and the one or more sensors.

8. The linear fader of claim 1, wherein each of the one or more sensors comprises a magnetic sensor configured to detect a magnetic field of the magnet.

9. The linear fader of claim 8, wherein each magnetic sensor comprises a Hall-effect sensor.

10. The linear fader of claim 1, wherein the one or more sensors are spaced along at least one side of the rail.

11. The linear fader of claim 1, wherein a first portion of the first electrical current passes through the first portion of the plurality of coils, wherein a second portion of the first electrical current passes through the second portion of the plurality of coils, and wherein a first force of a first magnetic field generated by the first portion of the electrical current applied to the magnet balances a second force of a second magnetic field generated by the second portion of the first electrical current applied to the magnet.

12. The linear fader of claim 11, wherein the magnet comprises a plurality of north poles and a plurality of south poles.

13. The linear fader of claim 1, wherein the plurality of coils are formed in a printed circuit board.

14. The linear fader of claim 1, wherein the control circuitry is further configured to control a second electrical current that passes through the plurality of coils, wherein an opposing magnetic field of the second electrical current through the plurality of coils resists movement of the slider along the rail, and wherein the resistance of movement simulates a desired feel-effect.

15. The linear fader of claim 14, wherein the control circuitry is further configured to receive a signal indicative of the desired feel-effect, and wherein the control circuitry is configured to control the second electrical current in response to receiving the signal indicative of the desired feel-effect.

16. The linear fader of claim 15, wherein the desired feel-effect comprises at least one of a coggy feel, a notchy feel, an end-stop feel, or a friction of movement feel.

17. A method comprising:

receiving, from at least one sensor, a location of a slider along a rail, wherein each sensor is configured to sense a magnetic field of the slider;

receiving, from a remote processing circuit, a signal corresponding to a desired location of the slider; and causing a first electrical current to pass through a plurality of coils that are spaced along a length of the rail, wherein a first portion of the plurality of coils is spaced along a first side of the rail, and wherein a second portion of the plurality of coils is spaced along a second side of the rail, wherein the first electrical current generates a magnetic field that applies a force on the slider, and wherein the force on the slider is in a direction toward the desired location.

18. The method of claim 17, further comprising:

receiving a second location of the slider from at least one sensor; and transmitting, to the remote circuit, a signal indicating the second location of the slider.

19. The method of claim 17, wherein causing the first electrical current to pass through the plurality of coils comprises:

causing a first portion of the first electrical current to pass through a first portion of the plurality of coils; and causing a second portion of the first electrical current to pass through a second portion of the plurality of coils, and wherein a first force of a first magnetic field generated by the first portion of the first electrical current applied to the magnet balances a second force of a second magnetic field generated by the second portion of the first electrical current applied to the magnet.

20. The method of claim 17, further comprising controlling a second electrical current that passes through the plurality of coils, wherein an opposing magnetic field of the second electrical current through the plurality of coils resists movement of the slider along the rail.

* * * * *